United States Patent [19]
Young et al.

[11] Patent Number: 5,455,782
[45] Date of Patent: Oct. 3, 1995

[54] DECIMATION FILTER AND METHOD

[75] Inventors: William R. Young; David B. Chester, both of Palm Bay, Fla.

[73] Assignee: Harris Corporation, Melbourne, Fla.

[21] Appl. No.: 930,169

[22] Filed: Aug. 14, 1992

[51] Int. Cl.⁶ .................................................. G06F 15/31
[52] U.S. Cl. .................................. 364/724.1; 364/724.13
[58] Field of Search ...................... 364/724.01, 724.10, 364/724.13, 724.17

[56] References Cited

U.S. PATENT DOCUMENTS

| | | | |
|---|---|---|---|
| 4,270,026 | 5/1981 | Shenoi et al. | 364/726.1 X |
| 4,872,129 | 10/1989 | Pfeifer et al. | 364/724.1 |
| 4,999,798 | 3/1991 | McCaslin et al. | 364/724.1 |
| 5,079,734 | 1/1992 | Riley | 364/724.1 |

*Primary Examiner*—Roy N. Envall, Jr.
*Assistant Examiner*—Chuong D. Ngo
*Attorney, Agent, or Firm*—Rogers & Killeen

[57] ABSTRACT

Programmable decimation filter made of integrators and combs with a shortened first integrator register and with a single subtractor plus memory for the combs subtractions. The comb subtractions are serially performed with read/write accesses to the memory. A shifter between the first and second integrator registers provides application to low decimation rates and the shortened register relates to device error rate at high decimation rates.

12 Claims, 22 Drawing Sheets

DECIMATION FILTER AND METHOD

BACKGROUND AND SUMMARY OF THE INVENTIONS

The present invention relates to electronic devices, and, more particularly, to semiconductor circuits and methods useful for filtering digital signals with a decimation of the sampling rate.

Digital Systems with Down Converters

Communications systems such broadcast radio use frequency division multiplexing (FDM) to simultaneously transmit differing information signals from several sources in a single locale. Typically, each source modulates its carrier frequency with its information signal and keeps within its allocated frequency band. Extraction of a desired information signal from a received broadband of simultaneous broadcasts may be performed by mixing down (down conversion by the selected carrier frequency) followed by lowpass filtering and demodulation as schematically illustrated by system 100 in FIG. 1. Indeed, system 100 receives radio frequency signals (e.g., 100–200 MHz) at antenna 102, filters and mixes the signals down to intermediate frequencies (e.g., 1–10 MHz) with a wideband tuner 104, converts from analog to digital format with sampling analog-to-digital converter 106, extracts the selected frequency band (e.g., of width 5 KHz) with digital down converter 108 which performs the down conversion and filtering, and demodulates and reconstructs an analog information signal with demodulator/processor 110. For example, if wideband tuner 104 has a 10 MHz output bandwidth, then analog-to-digital converter 106 will sample at 20 MHz or more (at least the Nyquist rate), and digital down converter 108 will output a 5 KHz selected band at a sampling rate of 10 KHz. That is, digital down converter 108 decimates (decreases) the sampling rate due to the small bandwidth of its output without loss of information. And this lower sampling rate implies simpler signal processing hardware may be used.

The problems of construction of system 100 include realizing digital down converter 108 operating at a high sampling frequency while maintaining a low ripple sharp cutoff filter which has programmable down conversion frequency and programmable bandwidth. Known realizations of a down conversion function include the combination of a numerically controlled oscillator/modulator (NCOM) such as the HSP45106 manufactured by Harris Corporation together with two digital decimation filters (one for the in-phase and one for the quadrature outputs of the NCOM) such as the HSP43220 also manufactured by Harris Corporation. A single chip realization such as the GC1011 digital reciver chip is manufactured by Graychip, Inc.

Crochiere and Rabiner, Multirate Digital Signal Processing (Prentice-Hall 1983) provides general information regarding signal processing using sampling rate changes.

Decimation Filters

Decimation filters provide a reduction in sampling rate. However, a simple sampling rate reduction in a signal generates an aliasing problem because frequencies which are between the original Nyquist rate and the decimated Nyquist rate will alias to frequencies is less than the decimated Nyquist rate. As a simple example, consider the analog signal $\cos(2\pi ft)$ of frequency $f$ sampled at an original sampling rate of $f_S = 1/T$ to yield the sample stream $x(n) = \cos(2\pi fnT)$. If the Nyquist rate $f_S$ is to be decimated by a factor of $R$, then the decimated signal $y(m)$ arises from taking every Rth sample of $x(n)$. That is, $y(m) = x(Rm) = \cos(2\pi fmRT)$. Now if $f$ lies between $f_S k/2R$ and $f_S(k+1)/2R$ for some integer $k$ less than $R$, then $\cos(2\pi[f-f_S k/2R]mRT) = \cos(2\pi[f-k/2RT]mRT) = \cos(2\pi fmRT - 2\pi km) = \cos(2\pi fmRT)$. This shows that frequency $f$ appears the same as frequency $f-f_S k/2R$ when the sampling rate drops from $f_S$ to $f_S/R$. In fact, $R-1$ different frequencies alias to each frequency in the range 0 to $f_S/2R$.

Consequently, a lowpass decimation filter must limit this aliasing arising from the sampling rate decimation which would otherwise appear in its passband. Aliasing outside of the passband is not a problem if a subsequent filter provides a stopband to cover this portion of the spectrum. FIG. 2 illustrates the required frequency response of a lowpass decimation filter in terms of the original sampling frequency. The broad transition band which experiences aliasing can be covered by the subsequent filter.

One approach to decimation filters appears in Hogenauer, An Economical Class of Digital Filters for Decimation and Interpolation, 29 IEEE Tr. ASSP 155 (1981). Hogenauer uses a series of integrators followed by a sample rate compressor which feeds a series of combs as illustrated schematically in FIG. 3. FIG. 3 employs standard notation: the z variable indicates a z-transform, and thus $z^{-1}$ indicates a delay of one. Indeed, with a decimation rate of R and N integrators and N combs, the overall system function can be read off FIG. 3 to be $H(z) = (1-z^{-R})^N / (1-z^{-1})^N$ which equals $(1+z^{-1}+z^{-2}+\ldots+z^{-(R+1)})^N$. The frequency response of the filter follows from $z = e^{j2\pi f}$, so the magnitude of the frequency response equals $$|\sin(\pi Rf)/\sin(\pi f)|^N$$

FIG. 4 shows the freqeuency response magnitude with respect to the original sampling frequency. Note the nulls when Rf equals a nonzero integer; these are the centers of the bands which alias to 0.

An N-stage (N integrators and N combs) Hogenauer decimation filter can be realized as N registers and adders for the integrators and N registers and subtractors for the combs. However, at first glance such registers appear impractically large. In particular, the sum in the Nth integrator's register could increase on the order of the N power of the number of data samples which have entered the filter. But the combs take differences, and this effectively makes the absolute size of the sums in the integrator's registers insignificant. Only bits up to a most significant bit need be kept.

In more detail, the system function $H(z) = (1+z^{-1}+z^{-2}+\ldots+z^{-(R+1)})^N$ is just the z-transform of the impulse response $h(m)$ defined by $H(z) = \Sigma h(m) z^{-m}$. Multiplying out the Nth power polynomial easily yields $h(m)$ which appears in FIG. 5. All of the coefficients $h(m)$ are nonnegative because the Nth power polynomial has all nonnegative coefficients. Of course, an Nth power of a z-transform equates to an N term convolution in the time domain, so $h(m)$ has the expected normal distribution look as follows from the Central Limit Theorem. Now the maximum filtered output data sample magnitude is just $\Sigma h(m)$ times the maximum input data sample magnitude because the sequence $h(m)$ is the impulse response. This sum may be trivially evaluated by putting $z=1$ in $H(z) = \Sigma h(m) z^{-m}$ and in $H(z) = (1+z^{-1}+z^{-2}+\ldots+z^{-(R-1)})^N$ to yield $\Sigma h(m) = R^N$. This means that the magnitudes of the filtered output data samples are bounded by $R^N$ times the maximum magnitude of the input data samples. For example, if the input data samples were 17 bits, and the decimation rate were 1024 in a five stage filter, then the output data samples would have at most 67 bits. That is, $1024^5$ equals $2^{50}$, so the outputs would have at most 50 more bits than the inputs.

This increase in magnitude by a factor of $R^N$ is intuitively obvious: Let M be the maximum magnitude of the input data samples. Then during the R clocks between successive inputs to the first comb, the first integrator increases its sum by at most RM. If the input data samples had all been 0, then the first integrator's sum would be constant during these R clocks. For an initial condition of all zeros in the integrators, the following analysis is valid, and a reset prior to use will insure this. Thus during the R clocks the second integrator increases its sum by at most R(R−1)M/2 over the increase which would have occurred from all 0 data samples and the first integrator's sum constant. Similarly, the third integrator has a sum increase of at most R(R−1)(R−2)M/6 over the increase due to all 0 data samples. Hence, the Nth integrator has an increase of at most R(R−1) . . . (R−N+1)M/N! over the increase due to all 0 data samples. The increase of R(R−1) . . . (R−N+1)M/N! essentially equals $R^N$M/N! for R much larger than N. The combs are differencers and will generate an N! factor, so maximum magnitude inputs (all with the same sign) have a net magnitude increase of about $R^N$.

In Hogenauer's notation, if the input has bits labelled 0, 1, . . . $B_{in}$−1, then the most significant bit number $B_{MAX}$ in the output equals the smallest integer not less than $\log_2 R^N$+ $B_{in}$−1. That is, the gain of $R^N$ increases the number of bits by $\log_2 R^N$.

The fact that the filtered output data samples have a most significant bit bounded by $B_{MAX}$ implies that bits greater than $B_{MAX}$ may be discarded in all of the registers making up the integrators and combs. This follows from modulo arithmetic because the integrators and combs just do addition and subtraction. More heuristically, the last comb takes the difference of two numbers, say A and B, which coincide for all bits above $B_{MAX}$, so discarding such coincident bits will not affect the difference output. In the next to last comb, the output A is the difference of two numbers, say L and M, and the output B is the difference of two numbers, M and say N. But the bits greater than $B_{MAX}$ in L differ from those in M by the same amount that those in M differ from those in N, so if all of these bits were discarded, there would be no loss of information. Similarly, going back to the first comb; note that this is just the reverse of the observation of increases in the integrators due to 0 data samples and the further increases or decreases from informational data samples. Because the first comb may discard bits greater than $B_{MAX}$, these bits may be discarded in the last integrator. Similarly, going back through the integrators because they add, all bits greater than $B_{MAX}$ may be discarded.

Hogenauer also shows that the least significant bits in the integrator and comb registers can be truncated (and thereby shrink the register sizes) at levels which generate less error than the quantization noise of the output. In particular, let $h_j(m)$ be the impulse response for input directly into the jth integrator. Thus truncation of B bits in the jth integrator produces a noise with mean $2^B/2$ and variance $2^{2B}/12$ in this jth integrator which leads to a noise with variance $(2^{2B}/12)(\Sigma h_j(m)^2)$ at the output because the impulse response coefficients multiply uncorrelated independent inputs. Hence, truncation or rounding of $B_{2N+1}$ bits at the output will generate output noise with variance at least as great as the variance of the output noise generated by the truncation of B bits in the jth integrator provided that, roughly, B is no greater than $B_j$ with:

$$B_j = B_{2N+1} - [\log_2(\Sigma h_j(m)^2)]/2$$

Computation of the $h_j(m)$ is straightforward. A similar condition holds for the combs which Hogenauer labels with j running from N+1 to 2N, and thus the notation $B_{2N+1}$ for the output bit numbers. This $B_j$ definition differs slightly from that in Hogenauer who takes the sum of the variances of the truncation noises generated in all N integrators and N combs as not exceeding the noise generated by output truncation or rounding. FIG. 6 heuristically illustrates the integrator and comb registers without the adders and subtractors for the case of 5 stages; bits transfer horizontally. FIG. 6 also shows $B_{MAX}$ and bit truncations $B_j$ for the case of decimation rate R equal to $2^{15}$, 17-bit input ($B_{in}$=17) so $B_{MAX}$=91, and 18-bit output ($B_{2N+1}$=73). In particular, note that rather than a total of 920 register bits, only 403 total register bits are needed.

FIG. 7 heuristically shows the registers of a decimating filter made of integrators and combs and with an input multiplexer which provides a programmable decimation rate as follows. Presume a maximum decimation rate of $2^{13}$, a filter with five stages, input data samples with 17 bits, and output samples with 18 bits. Thus $B_{MAX}$ equals 13×5+17−1, or 81, so the integrator and comb registers before truncation have 82 bits numbered 0 to 81. With an 18 bit output, computing the allowable truncation $B_j$ in each register as in Hogenauer yields the register sizes shown in FIG. 7. Now if the decimation rate had instead been $2^5$, for example, then $B_{MAX}$ would have been 5×5+17−1, or 41. Thus the registers could have been 40 bits smaller before truncation than with the $2^{13}$ decimation rate. But the same hardware can be used as in the $2^{13}$ decimation rate filter by simply shifting the input up 40 bits as illustrated in FIG. 7 by the shifter. Indeed, any decimation rate less than $2^{13}$ can be accommodated by an appropriate shift of the input so that $B_{MAX}$ aligns with the MSB in the registers.

Taking the output with its MSB at $B_{MAX}$ in the last comb compensates for the filter gain of $R^5$ when R is a power of 2, and makes the overall gain fall inside the range of ½ to 1 when R is not a power of 2. A simple example: a decimation rate of 32 implies a gain of $32^5(=2^{25})$ which means exactly 25 additional bits are required, whereas a decimation rate of 30 implies a gain of only $30^5$ which requires 24.534 . . . additional bits. However, bits are indivisible so 25 additional bits must be provided at the output in both cases. This means dividing out a gain of $2^{25}$ in both cases. Indeed, the gain $30^5$ has (unsigned) leading bits 10111001 . . . . This means the maximum magnitude of a positive output sample is 10111001 . . . rather than 11111 . . . , and the overall gain (after dividing out the $2^{25}$ gain) is 0.724 which equals 0.10111001 . . . , as expected.

However, Hogenauer's decimating filter has the problems of register size in both the integrators and combs. Every register bit also requires a further bit of adder or subtractor, and the number of bits increases rapidly as the number of filter stages increases.

Features

The present invention provides a digital decimating filter using integrators and combs with a programmable decimation rate but with the comb registers replaced by a single subtractor plus memory, and with one or more shortened integrator registers. For the shortened integrator registers, an alignment shifter permits wide decimation rate applications.

BRIEF DESCRIPTION OF THE DRAWINGS

The present invention will be described with reference to the accompanying drawings, which are schematic for clarity.

DESCRIPTION OF THE PREFERRED EMBODIMENTS

Minimum Decimation Rate Embodiment

Figure 1:
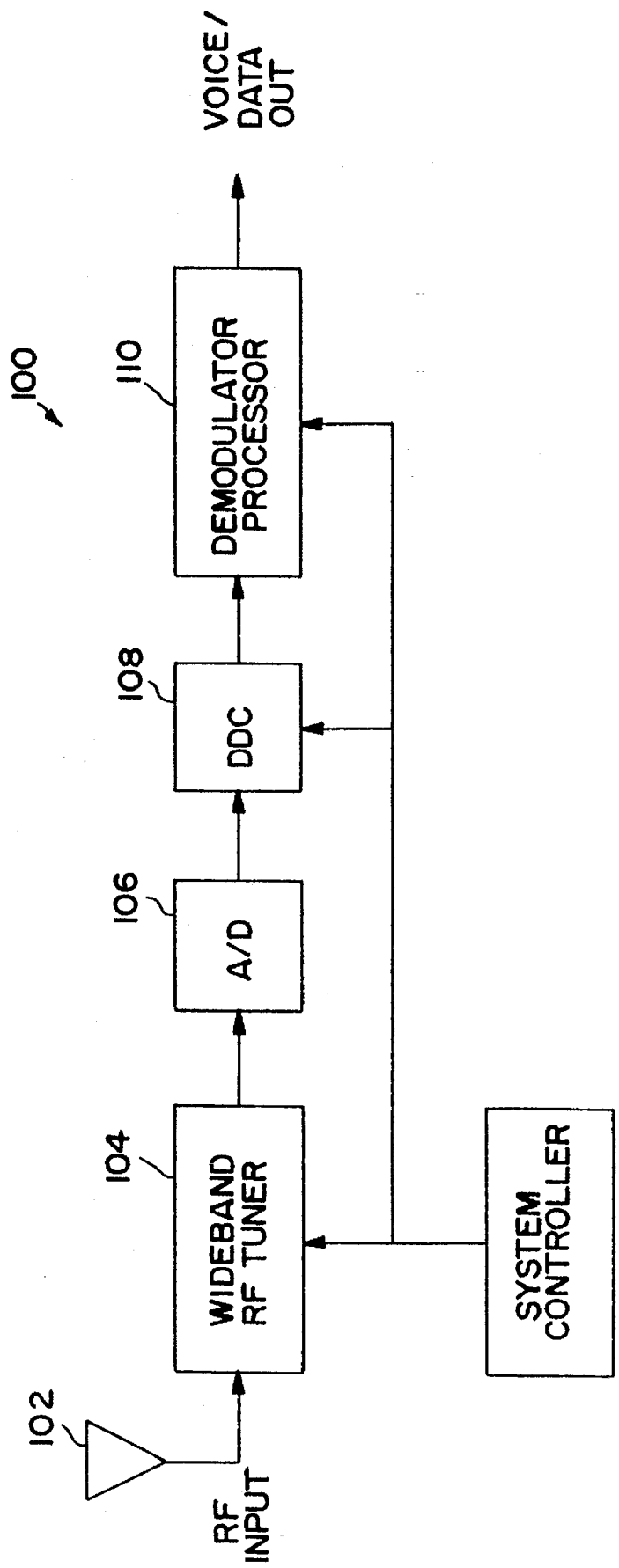
FIG. 1 illustrates a first application of a first preferred embodiment digital down converter.
Figure 2:
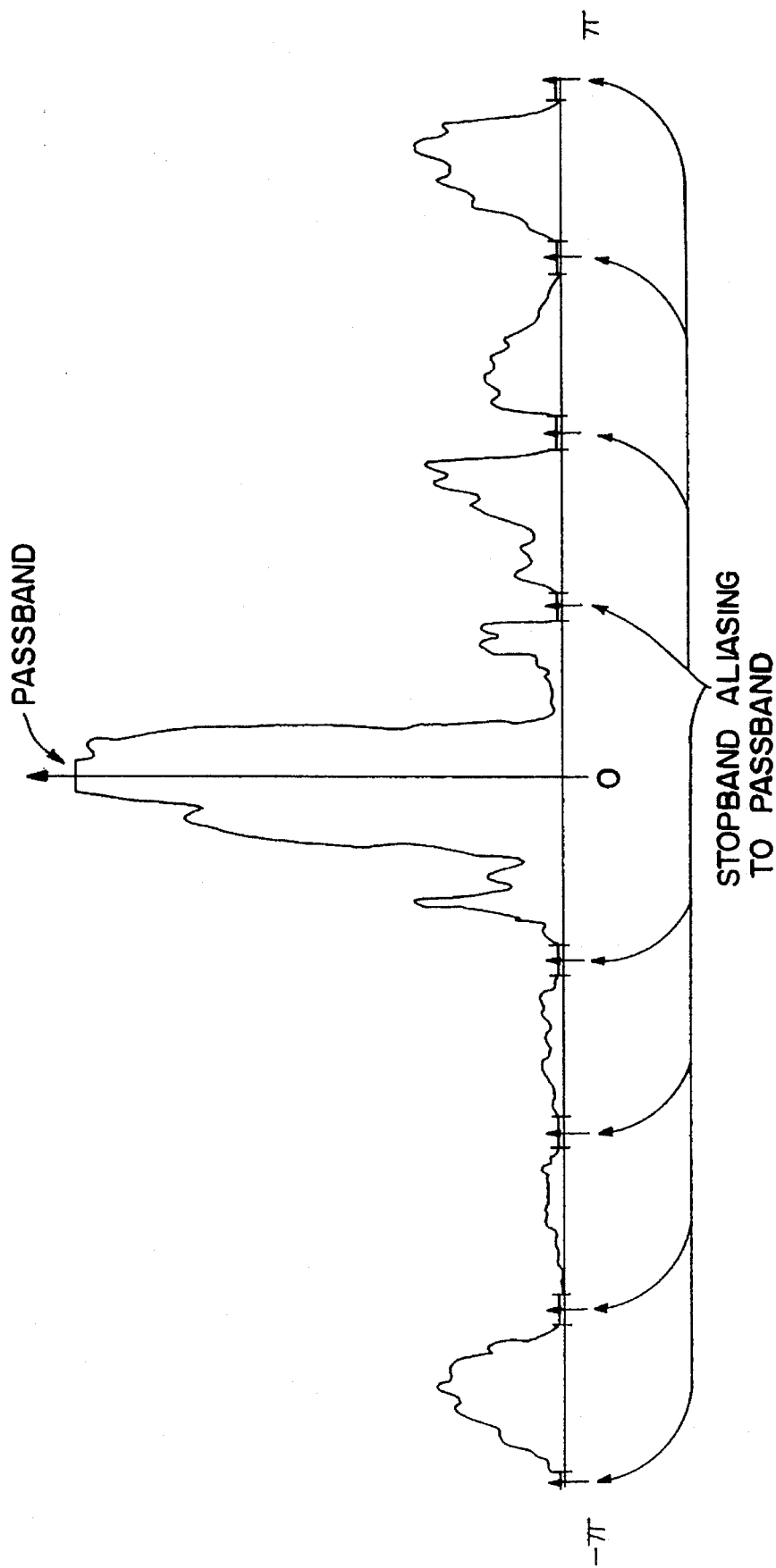
FIG. 2 shows a decimation filter system function.
Figure 3:
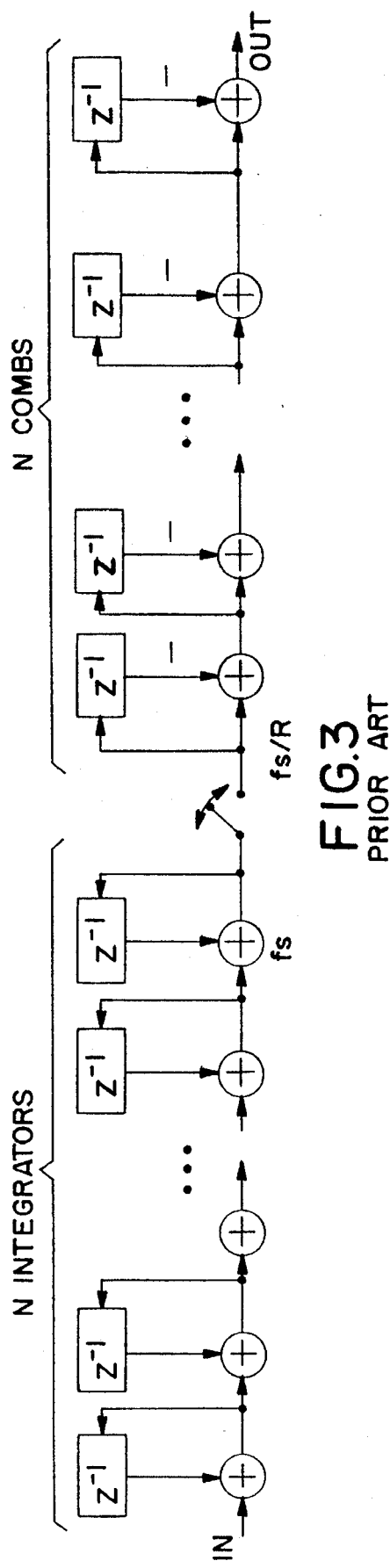
FIG. 3 shows a decimation filter made of integrators and combs.
Figure 4:
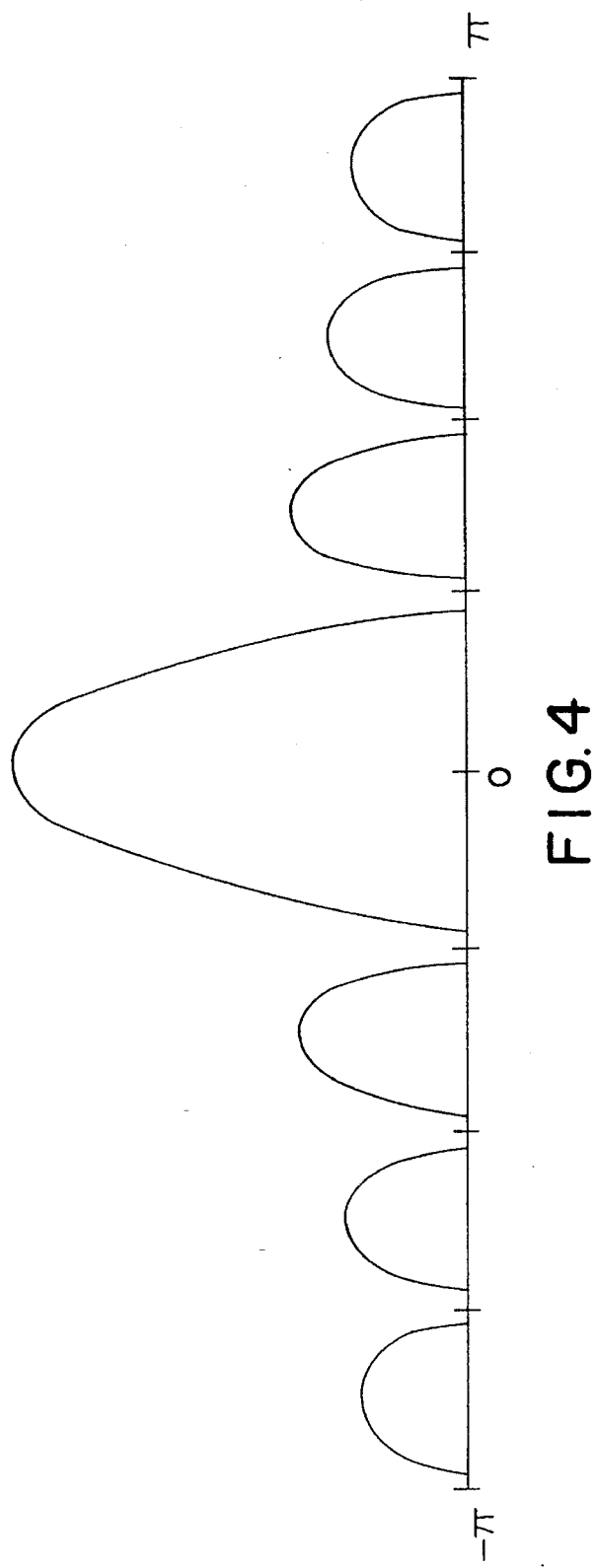
FIG. 4 illustrates the system function for the filter of FIG. 3.
Figure 5:
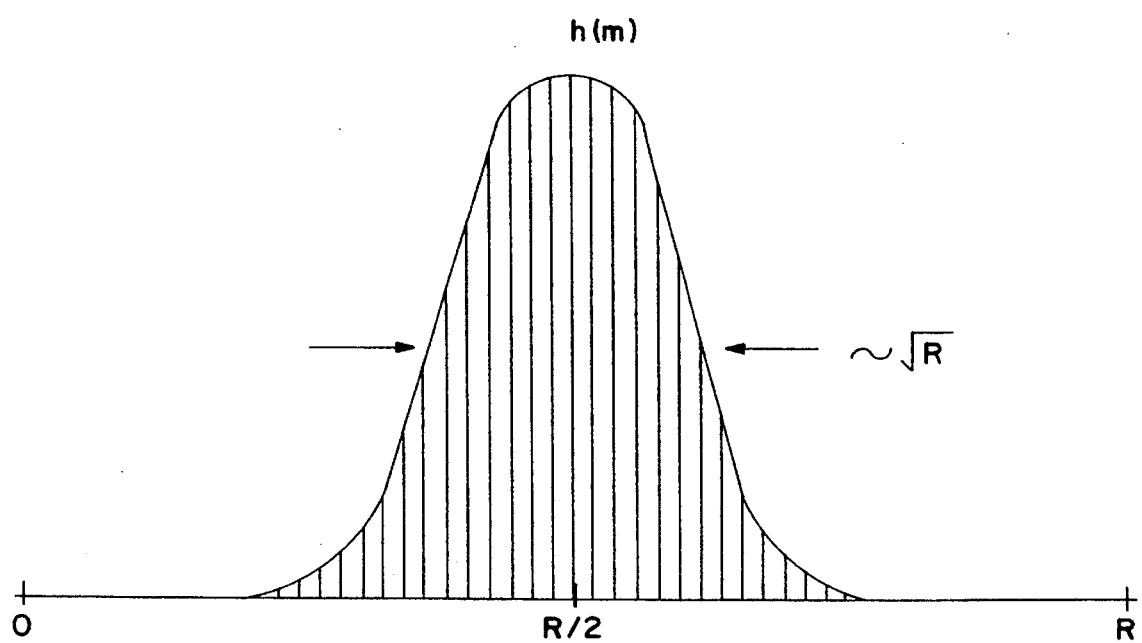
FIG. 5 graphs the impulse response of the filter of FIG. 3.
Figure 6:
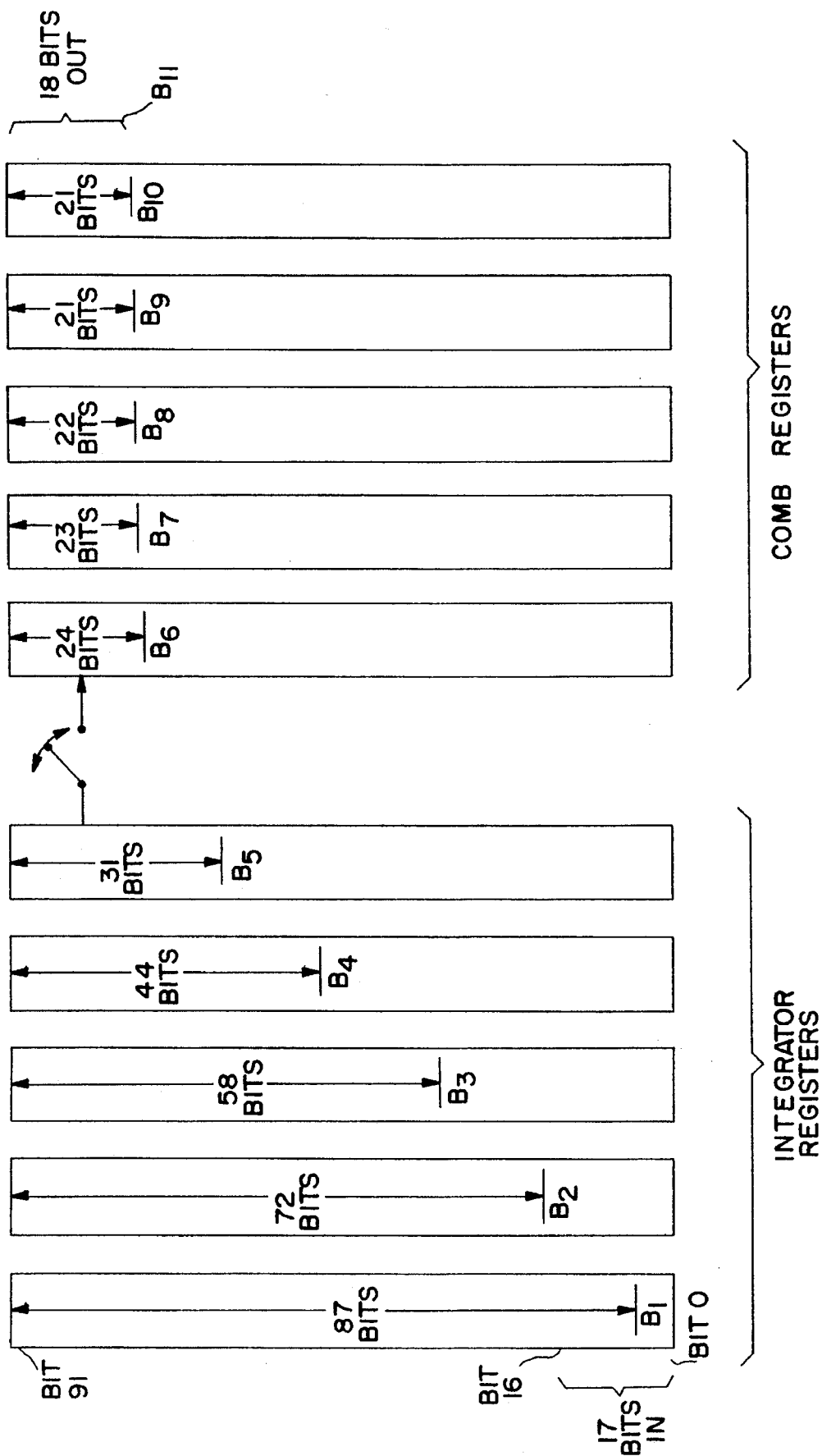
FIG. 6 shows the filter of FIG. 3.
Figure 7:
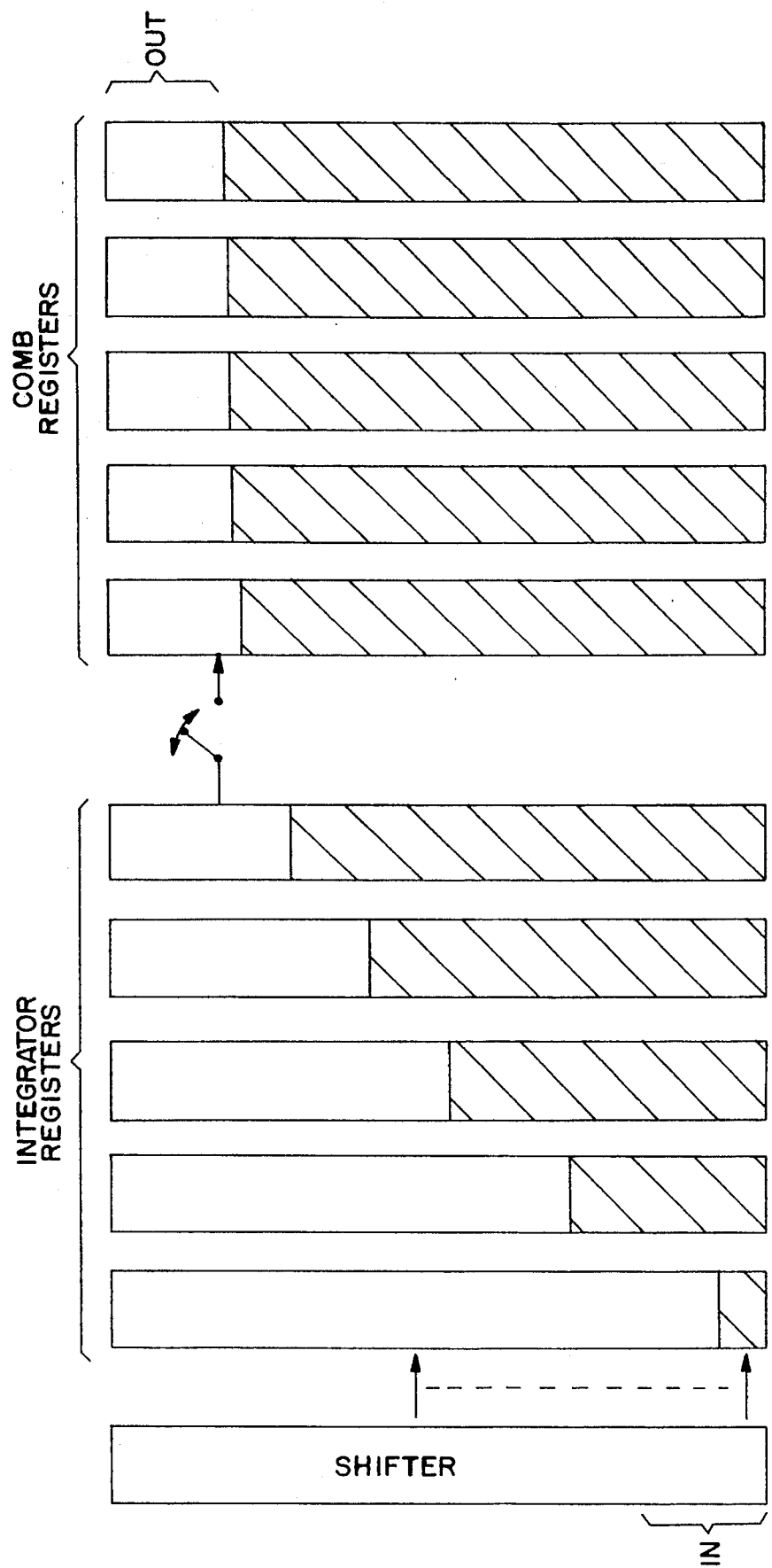
FIG. 7 illustrates a modification of the filter of FIG. 3.
Figure 8:
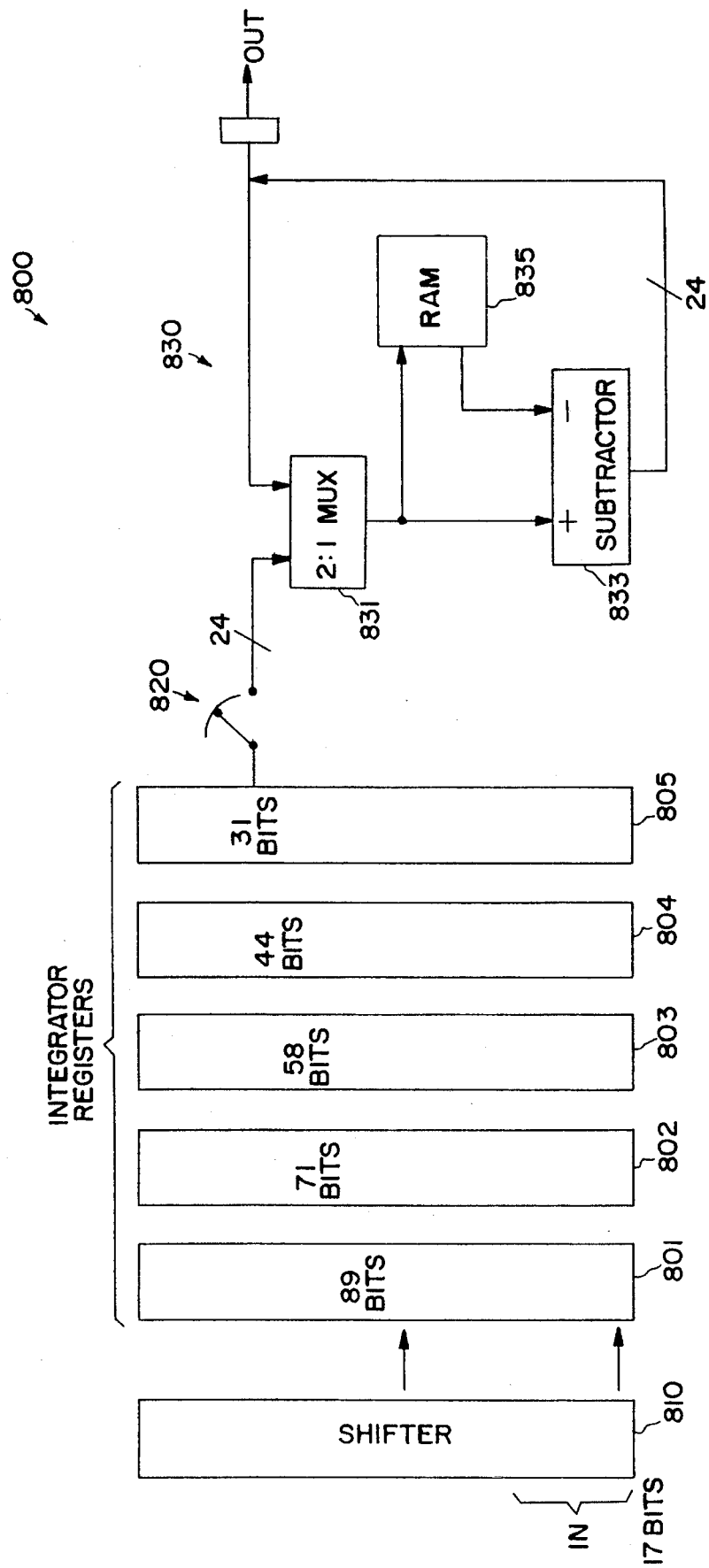
FIG. 8 shows a first preferred embodiment filter.

FIG. 8 heuristically shows a first preferred embodiment decimation filter, generally denoted by reference numeral 800, which includes five integrator stages 801–805, represented by their registers in FIG. 8, data shifter 810 for shifting input data samples into first integrator 801 to adjust for varying decimation rates, sampling rate decimator 820, and comb section 830 made of multiplexer 831, subtractor 833, and RAM 835. Comb section 830 replaces the five combs (each with a register plus subtractor) as illustrated in FIGS. 6–7 with a single subtractor plus RAM for holding the delayed inputs. In effect, subtractor 833 performs the subtractions of the usual five comb stages serially with RAM 835 holding all five delayed inputs. Because comb section 830 performs the five comb subtractions serially, the decimation rate must be at least five to allow sufficient subtraction time or the subtractions must be computed at faster than the original sampling rate. Note that shifter 810 provides sign extension bits for the input data samples. Thus with two's complement format, a negative data sample will be put into register 801 with leading bit 1s to fill up the most significant bits of the register and positive data sample will be put into register 801 with leading bit 0 to fill up the most significant bits of the register.

The decimation filter of FIG. 8 shows 17-bit input, a maximum decimation rate of $2^{15}$, and 18-bit output. This generates the integrator register sizes shown and requires 24-bit input into comb section 830. The following table shows the sequence of subtractions in comb section 830 for a minimal decimation rate of 5; with higher decimation rates the extra clock cycles basically are wait states. Note that mutiplexer 831 passes subtractor 833 output most of the time. Also, RAM 835 uses a read/write cycle in that a value is read out and then written over with an updated version from multiplexer 831. The sequence of inputs from the last integrator 805 is denoted . . . , w0, w1, w2, w3, w4, w5, w6, . . . and the table begins with w5 being input to comb section 830. In the MUX column "Sub" indicates that multiplexer 831 passes the output of subtractor 833. The final subtractor output is gated as the OUT output.

| Clock | MUX out | Read from RAM | Subtractor output | Write into RAM |
|---|---|---|---|---|
| 0 | w5 | w4 | . . . | w5 replaces w4 |
| 1 | Sub | w4−w3 | w5−w4 | w5−w4 replaces w4−w3 |
| 2 | Sub | (w4−w3)−(w3−w2) | (w5−w4)−(w4−w3) | (w5−w4)−(w4−w3) replaces (w4−w3)−(w3−w2) |
| 3 | Sub | [(w4−w3)−(w3−w2)]−[(w3−w2)−(w2−w1)] | [(w5−w4)−(w4−w3)]−[(w4−w3)−(w3−w2)] | . . . |
| 4 | Sub | {[(w4−w3)−(w3−w2)]−[(w3−w2)−(w2−w1)]}−{[(w3−w2)−(w2−w1)]−[(w2−w1)−(w1−w0)]} | {[(w5−w4)−(w4−w3)]−[(w4−w3)−(w3−w2)]}−{[(w4−w3)−(w3−w2)]−[(w3−w2)−(w2−w1)]} | . . . |
| 5 | w6 | w5 | ({[(w5−w4)−(w4−w3)]−[(w4−w3)−(w3−w2)]}−{[(w4−w3)−(w3−w2)]−[(w3−w2)−(w2−w1)]})−({[(w4−w3)−(w3−w2)]−[(w3−w2)−(w2−w1)]}−{[(w3−w2)−(w2−w1)]−[(w2−w1)−(w1−w0)]}) | w6 replaces w5 |
| 6 | Sub | w5−w4 | w6−w5 | w6−w5 replaces w5−w4 |
| 7 | Sub | (w5−w4)−(w4−w3) | (w6−w5)−(w5−w4) | (w6−w5)−(w5−w4) replaces (w5−w4)−(w4−w3) |
| . . . | . . . | . . . | . . . | . . . |

RAM 835 need hold only five 24-bit words as indicated by the Read from RAM column of the foregoing table. All writes to RAM 835 immediate follow a read at the same address. Thus specialized RAM architecture may be used to provide high speed.

Filter 800 eliminates four of the subtractors normally used by five combs through serial use of a single subtractor. The RAM holds five 24-bit words, about the same storage as the five registers normally used by five combs. Thus comb section 830 saves four subtractors at the cost of multiplexer 831 and the requirement of a minimum decimation rate of five. Indeed, input shifter 810 must be able to shift the 17-bit input to any of 56 consecutive 17-bit locations to cover a range of decimation rates from $2^4$ to $2^{15}$, inclusive, because $B_{MAX}$ varies from 36 to 91, inclusive.

Figure 9:
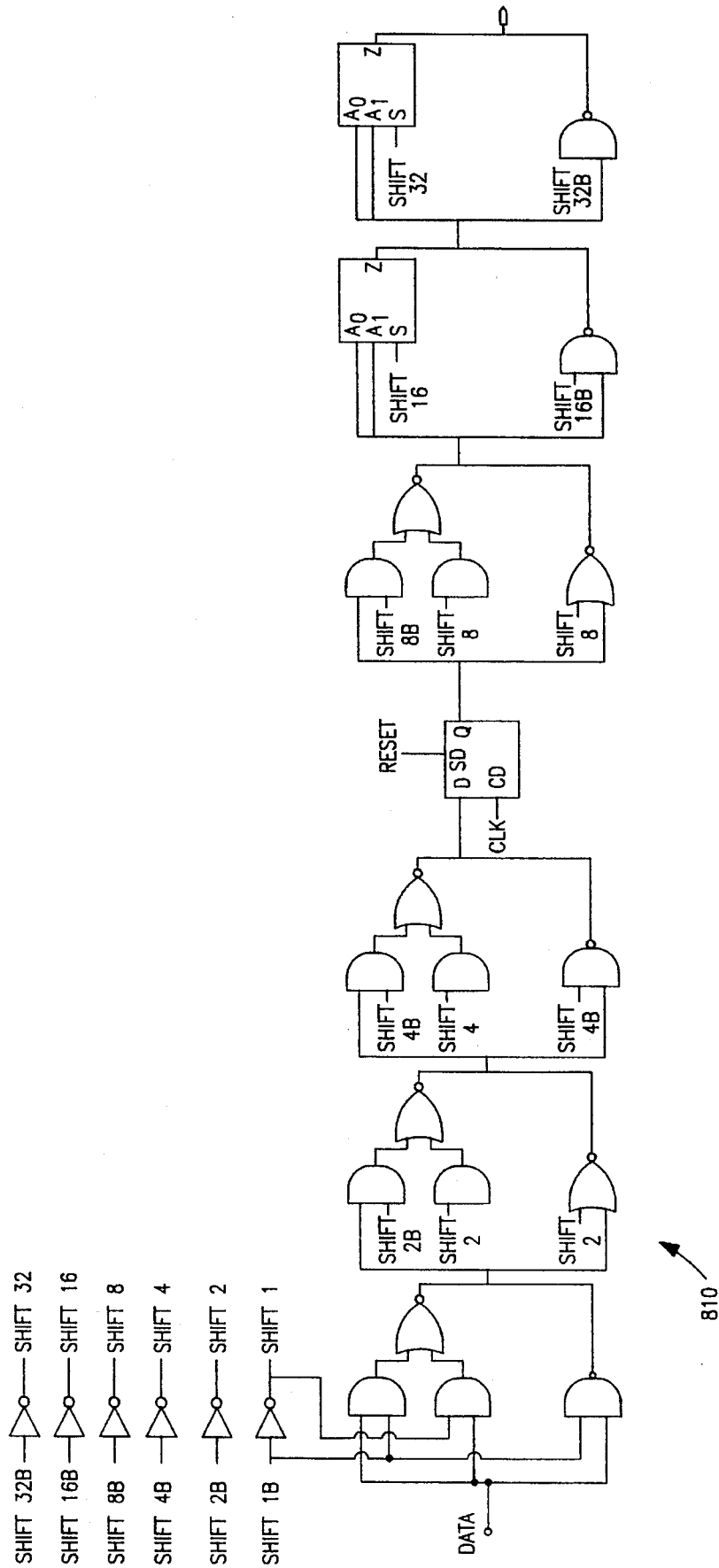
FIG. 9 is a schematic circuit diagram for a portion of the first preferred embodiment filter.

FIG. 9 shows an implementation of shifter 810.

Maximum Decimation Rate Embodiment

Figure 10:
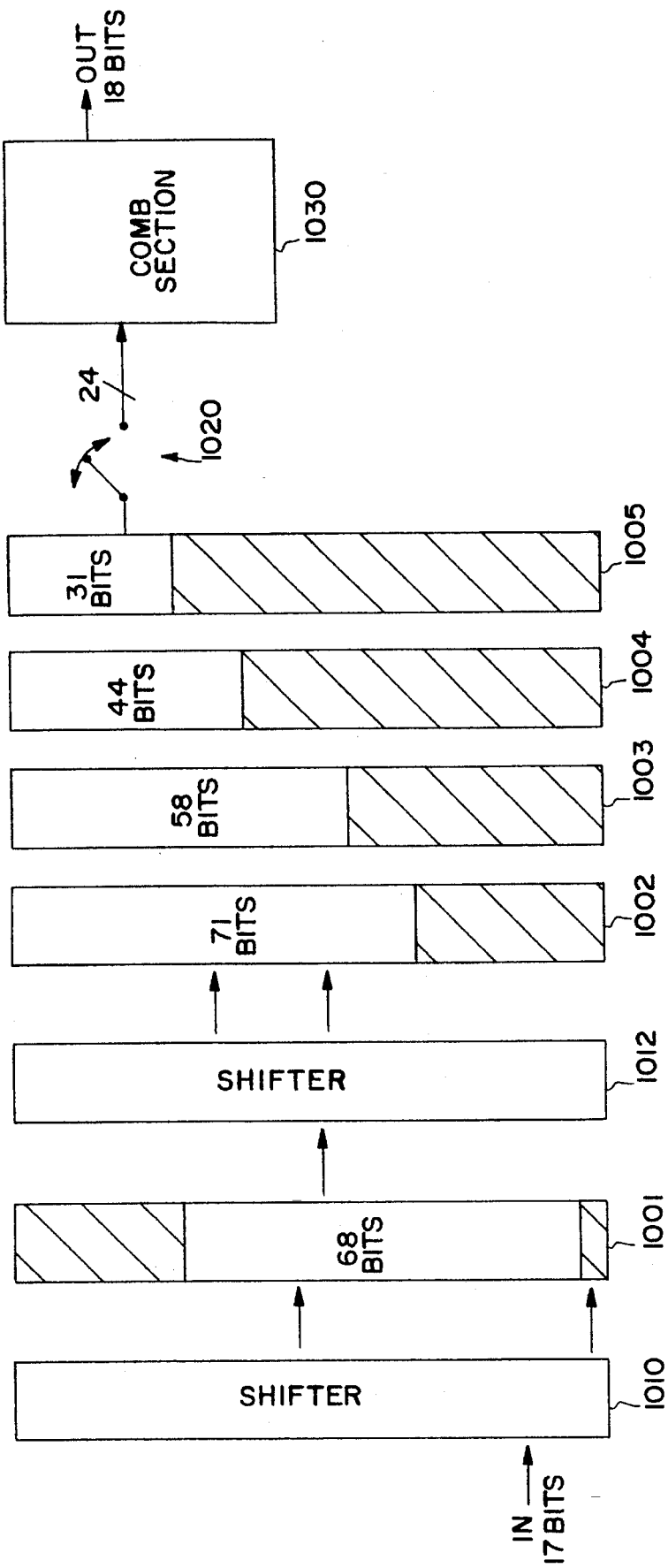
FIG. 10 shows a second preferred embodiment filter.

FIG. 10 heuristically shows a second preferred embodiment decimation filter, generally denoted by reference numeral 1000, which includes five integrator stages 1001–1005, represented by their registers in FIG. 10, shifter 1010 for shifting input data samples into first integrator 1001 to adjust for varying decimation rates, demultiplexer 1012 for aligning output of register 1001 with input of register 1002, sampling rate decimator 1020, and comb section 1030. Comb section 1030 may be five combs or may do serial subtraction as with comb section 830 if the minimum decimation rate of five may be imposed. Filter 1000 has first integrator register 1001 with fewer bits than the first integrator register 801 of filter 800, and demultiplexer 1012 compensates for this smaller register 1001 by providing alignment variation with register 1002 for decimation rates. FIG. 10 shows filter 1000 with the same parameters as the filters of FIGS. 6–8: decimation rates up to $2^{15}$ with 17-bit input data samples (so $B_{MAX}$ up to 91), and 18-bit output data samples. This smaller first integrator register 1001 operates as follows.

Initially, note that $B_{MAX}$ depends logarithmically on the decimation rate, and the size of the first register depends upon the largest $B_{MAX}$. However, the sum in the first register increases at most linearly in time and its MSB will not even approach $B_{MAX}$ within the expected lifetime of an integrated circuit. In particular, if a stream of data samples with maximum magnitude enter first integrator at a 50 MHz rate for 10 years, then the sum will be at most about $2^{54}$ times the sample magnitude. This means for 17-bit input samples the sum will have an MSB at bit 71 after 10 years of operation. Hence, if first register 1001 had bits 72–91 eliminated, then no effect would be seen for at least 10 years of operation. Of course, when such a shortened first register 1001 fills up and rolls over, the output will be erroneous for a few samples while the change in the shortened first integrator's sum worked its way through filter 1000. Further, with random data, the sum in first register 1001 only increases about as the square root of time, so after 10 years of operation the sum will be about $2^{27}$ times the sample maximum magnitude. Using this sum estimate, the first register could be shortened by another 20 bits.

Decimation rates less than the maximum decimation rate have smaller $B_{MAX}$s and require shifter 1010 to shift the input data samples towards the MSB end of register 1001, as described in connection with FIG. 7, to have their $B_{MAX}$s aligned with the output MSB. However, shortened register 1001 has had its MSB end eliminated, so for very low decimation rates a problem appears. Demultiplexer 1012 overcomes this low decimation rate problem by simply shifting regsiter 1001 relative to register 1002 so that the LSB end of register 1001 can be used. The choice of how much to shift can be made in many ways, and FIGS. 11–21 illustrate the preferred embodiment. Recall that the input data shifter in FIGS. 7–9 must be able to shift the 17-bit input to any of 56 consecutive 17-bit locations to cover a range of decimation rates from $2^4$ to $2^{15}$, inclusive, because $B_{MAX}$ varies from 36 to 91, inclusive. Filter 1000 breaks this shifting into two stages with the use of shifter 1010 and demultiplexer 1012. Shifter 1010 can shift to any one of thirty-six 17-bit locations on the input of register 1001, and demultiplexer 1012 can shift the output of register 1001 to any one of five locations, which are pairwise separated by 5 bits, on the input of register 1002.

In FIGS. 11–21 each vertical bar corresponds to the ith of N registers in either the filter integrator or comb filter subsection respectively. For example, the first vertical bar in FIG. 11 corresponds to the first integrator register. The second vertical bar corresponds to the second integrator register, etc. The horizontal lines on each bar represents a bit position numbered from b0 to bmax. The darkest shaded area on the vertical bars designate the bits that are actually implemented. The numbers to the left of the darkest shaded area represents the number of bits in the area. The medium shaded area on the first input register indicates the position relative to the register where the 17 input bits are located. The lightest shaded areas indicate bits that are truncated and are therefore not implemented. In all but the first register the truncation is from the bottom of the first integrator register. The top truncation is to account for the roll over period limit.

Figure 19:
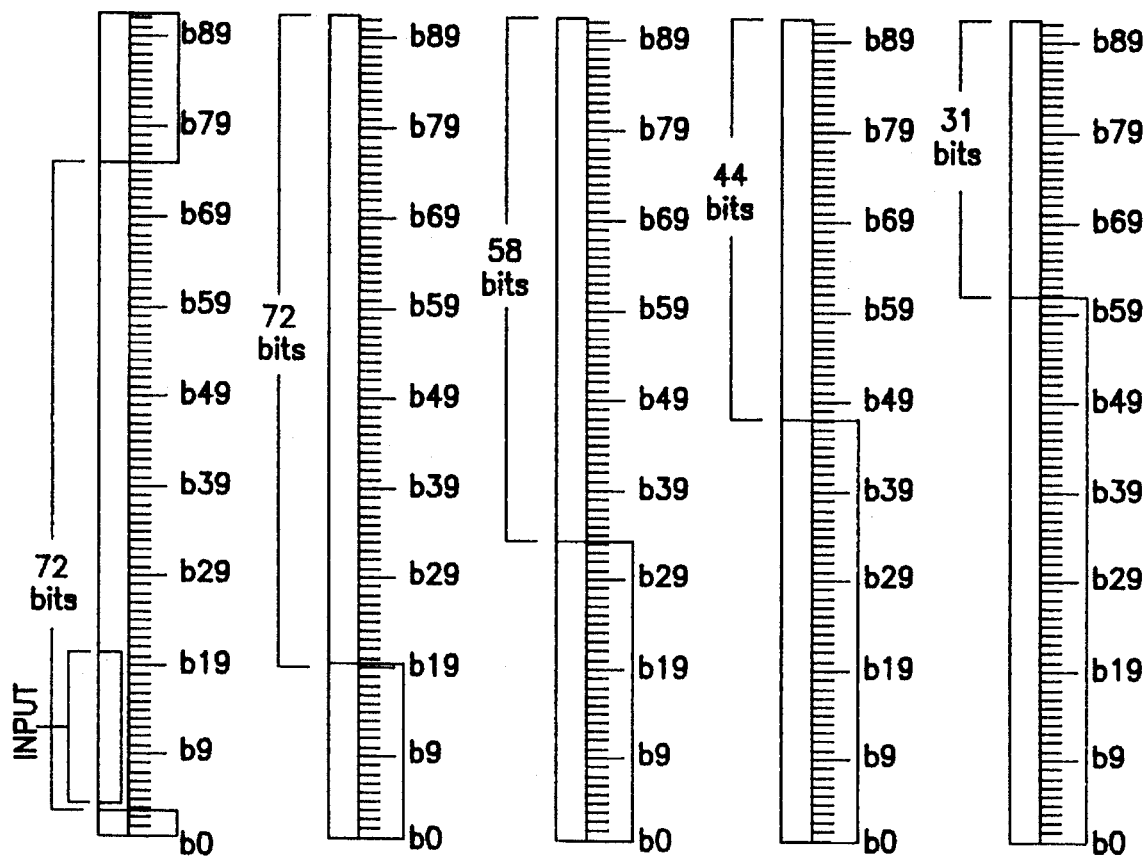
Figure 20:
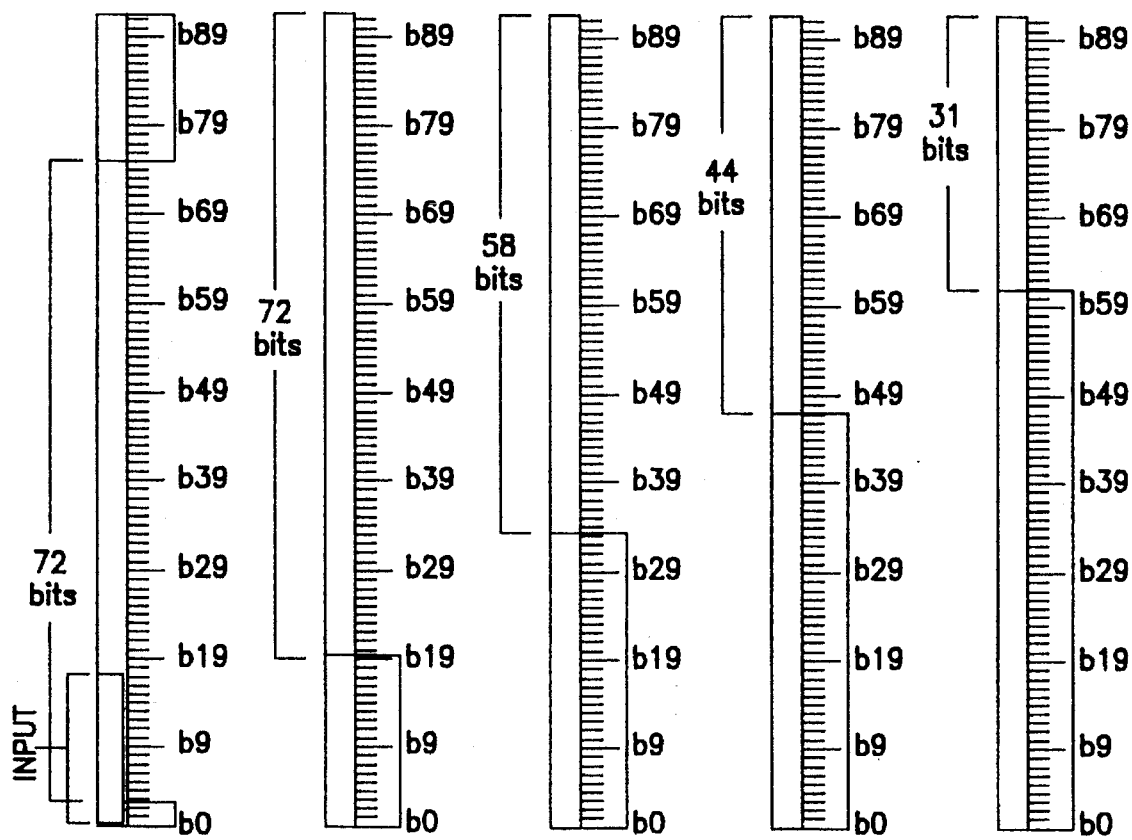
Figure 21:
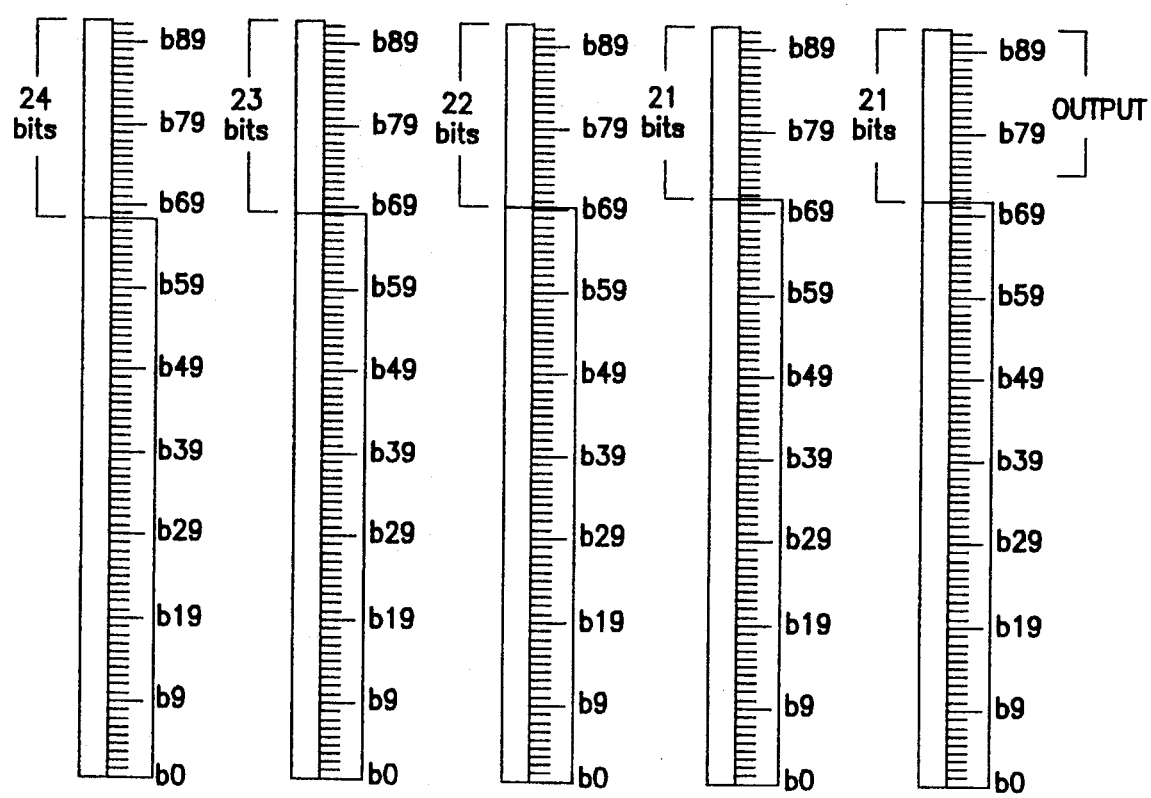

As seen in FIGS. 11–20 the last four integrator registers and all five comb filter registers, shown in FIG. 21, always have the same alignment relative to each other and are wide enough to accommodate register growth for decimation rates from 16 up to and including 32,768. This ability to accommodate register growth for all possible filter decimation cases is predicated on the correct orientation of the input word relative to the top of the registers.

If the top of the first register were always aligned with the top of all other registers a single 17 line 1 to 56 multiplexer would be required to position the 17 input bits in the correct orientation relative to the top of the filter. In addition, none of the top bits of the first integrator register could be truncated because the input bits are input nearest the top of the register for the lowest decimation rates. Thus the first integrator register bits that could be truncated for roll over periods of greater than ten years for higher decimation rates must be preserved for lower decimation rates. Only the bottom three bits of the first integrator register could be truncated resulting in an actual first integrator register length of 92−3=89 bits.

The selected alternative to this approach is to shift the first integrator register relative to the second integrator register. This is shown in FIGS. 11–20. For decimation rates of 16 through 2048 the first integration register is shifted up 20 bit positions (via multiplexer 1012 between the first and second integrator registers) relative to the rest of the filter registers so that bit b71 of the first register is aligned with bit b91 of the rest of the filter registers. Note that there are non-truncated bits in the first integration register beyond bit b71. The presence of these bits can be ignored when the first integration register is in this position relative to the rest of the filter registers. The need for these bits will become clear later in this discussion.

Figure 11:
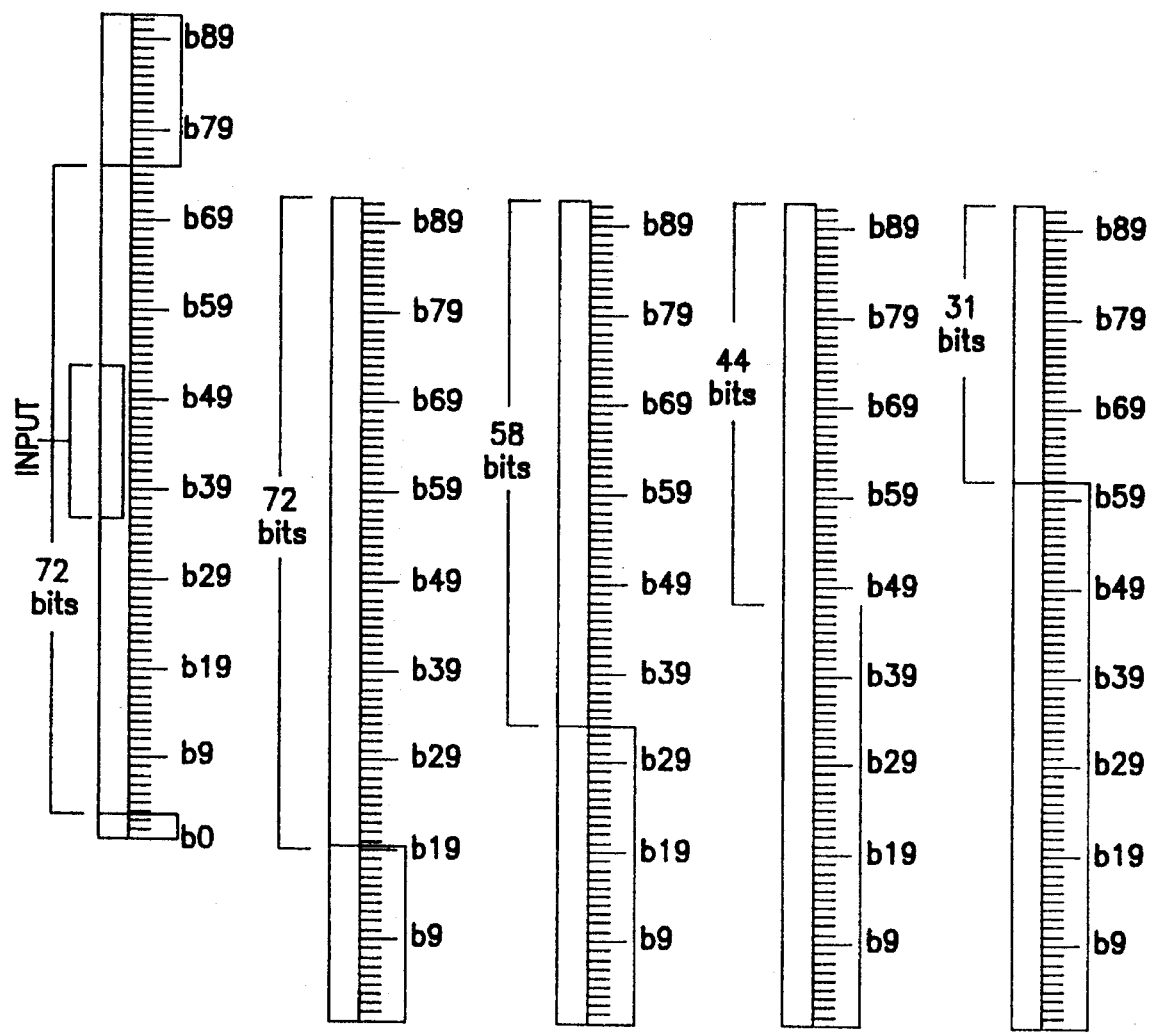
FIGS. 11–21 illustrate operation of the second preferred embodiment filter.
Figure 12:
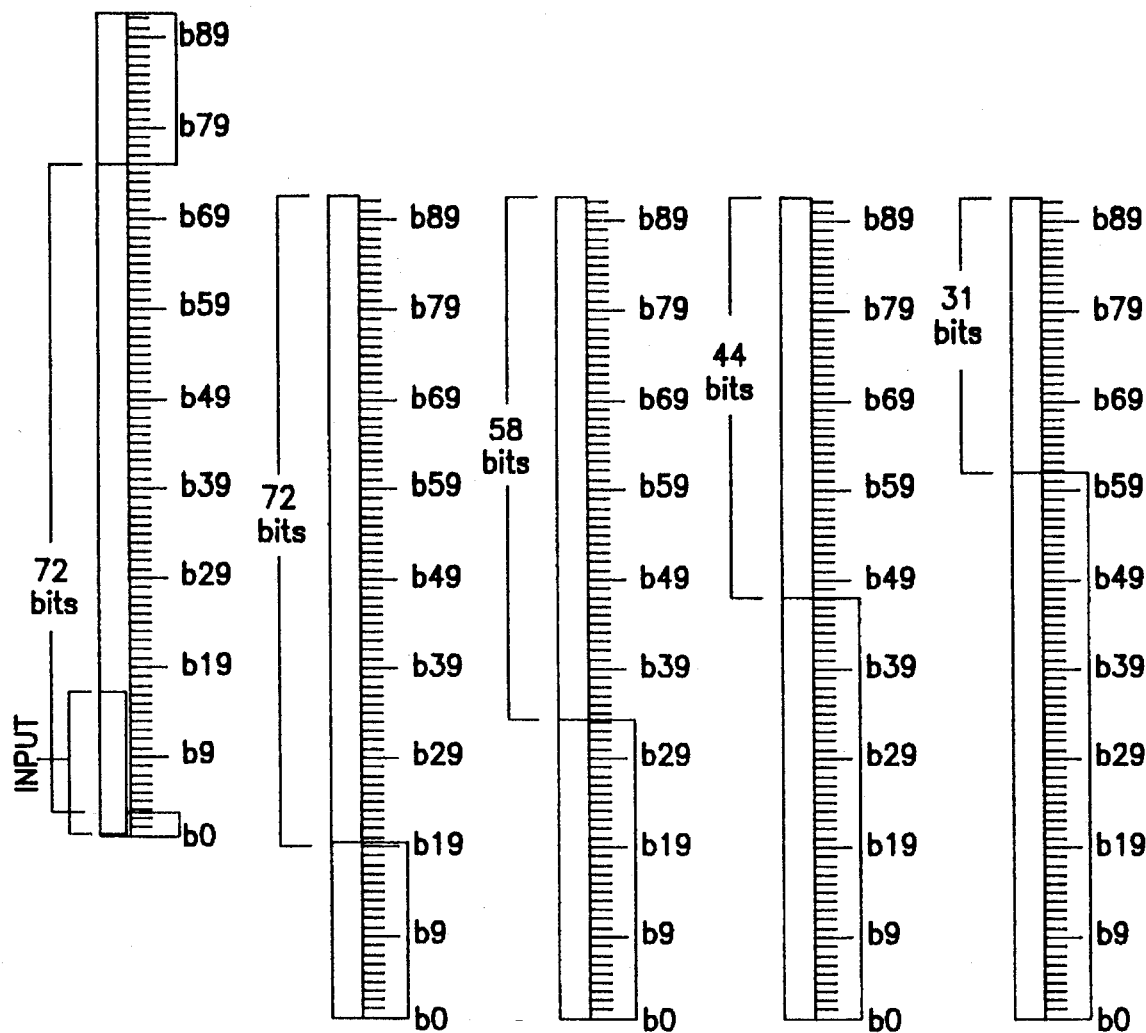

FIG. 11 shows the input word configuration and integrator register configuration for the case of decimation by 16. As decimation rates increase the input word position relative to the top of the filter registers shifts down by one bit at every time the decimation rate traverses a transition point signified by a change in bmax. When a decimation rate of 2048 is specified, the input register is at the bottom of the first integrator register. This is illustrated in FIG. 12. Because at least 3 bits can be truncated from the bottom of the input word for decimation rates locating the input word at the bottom of the first integrator register, these three bits are not implemented.

Figure 13:
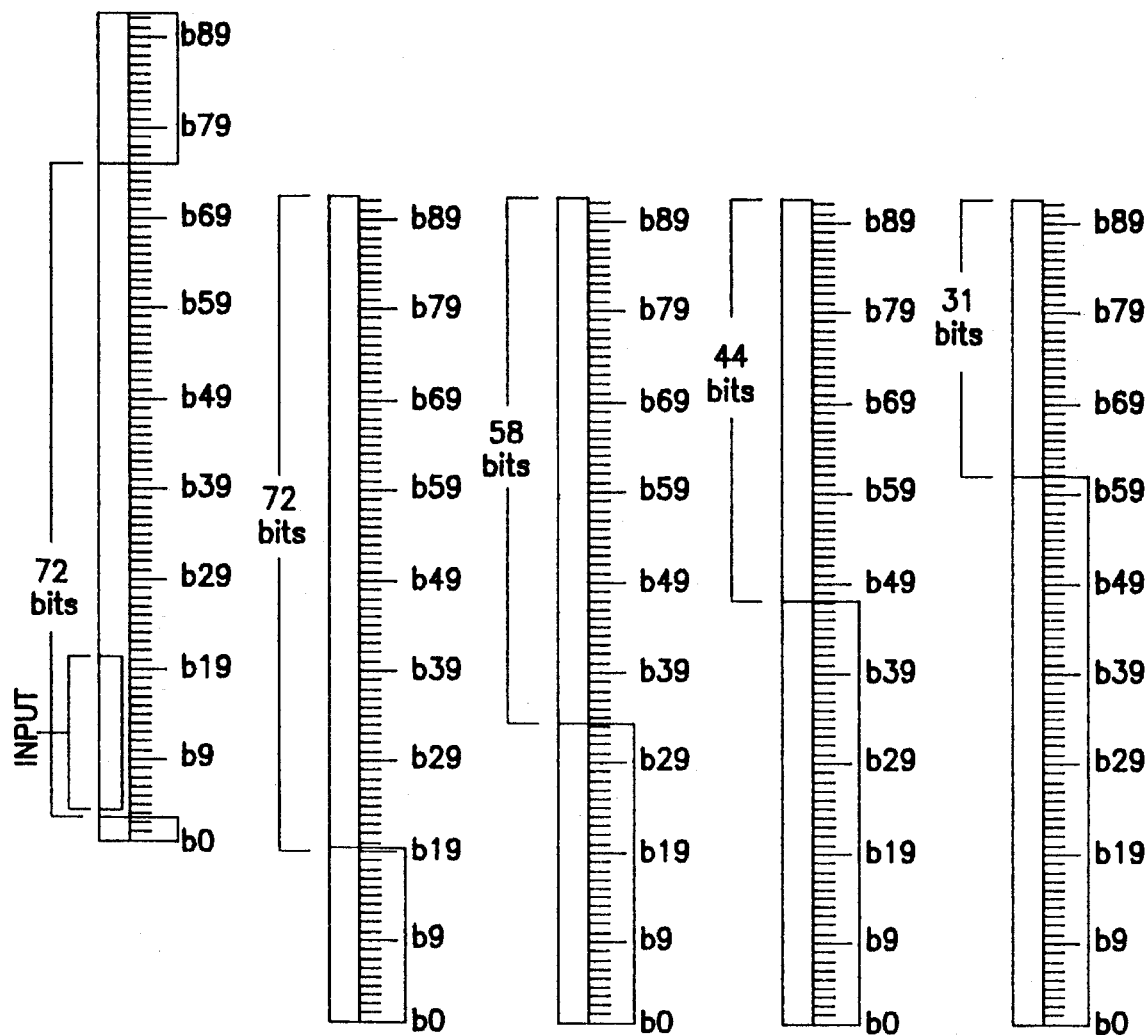

When a decimation rate of 2049 is specified, the first integrator register bit 76 is aligned with the top of the other filter registers and the top of the input word is aligned with bit b20 of the first integrator register. This configuration is shown in FIG. 13. Notice that this configuration represents the worst case first integrator register growth. 54 bits of growth must be allowed to meet the 10 year roll over period. This places the top of the implemented bits at first integrator register bit b20+54=b74. Thus the actual number of bits implemented in the first register is 75–3 (truncated off the bottom)=72.

Figure 14:
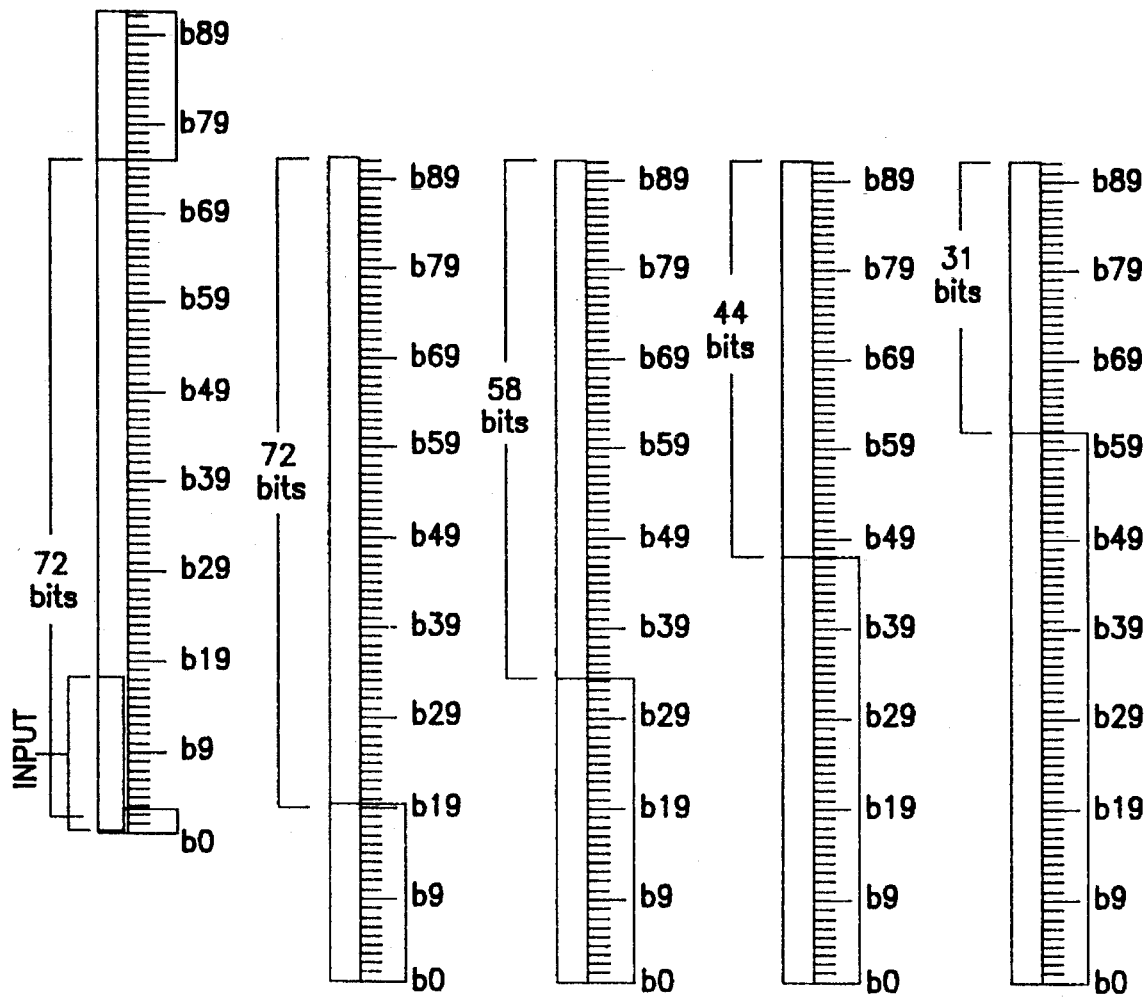

As decimation rates increase the input word position relative to the top of the filter registers shifts down by one bit at every time the decimation rate traverses a transition point signified by a change in bmax. When a decimation rate of 4096 is specified, the input register is at the bottom of the first integrator register. This is illustrated in FIG. 14.

Figure 15:
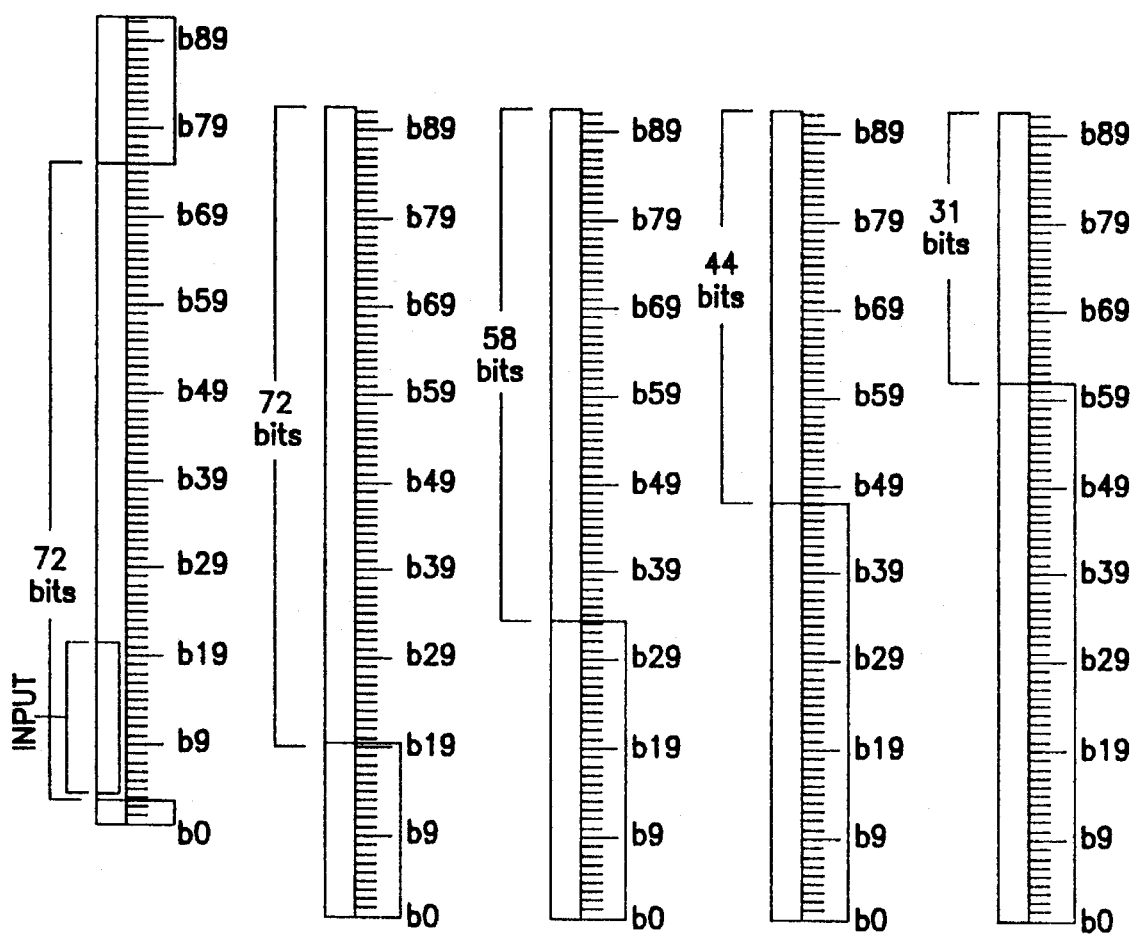

When a decimation rate of 4097 is specified, the first integrator register bit 81 is aligned with the top of the other filter registers and the top of the input word is aligned with bit b20 of the first integrator register. This configuration is shown in FIG. 15.

Figure 16:
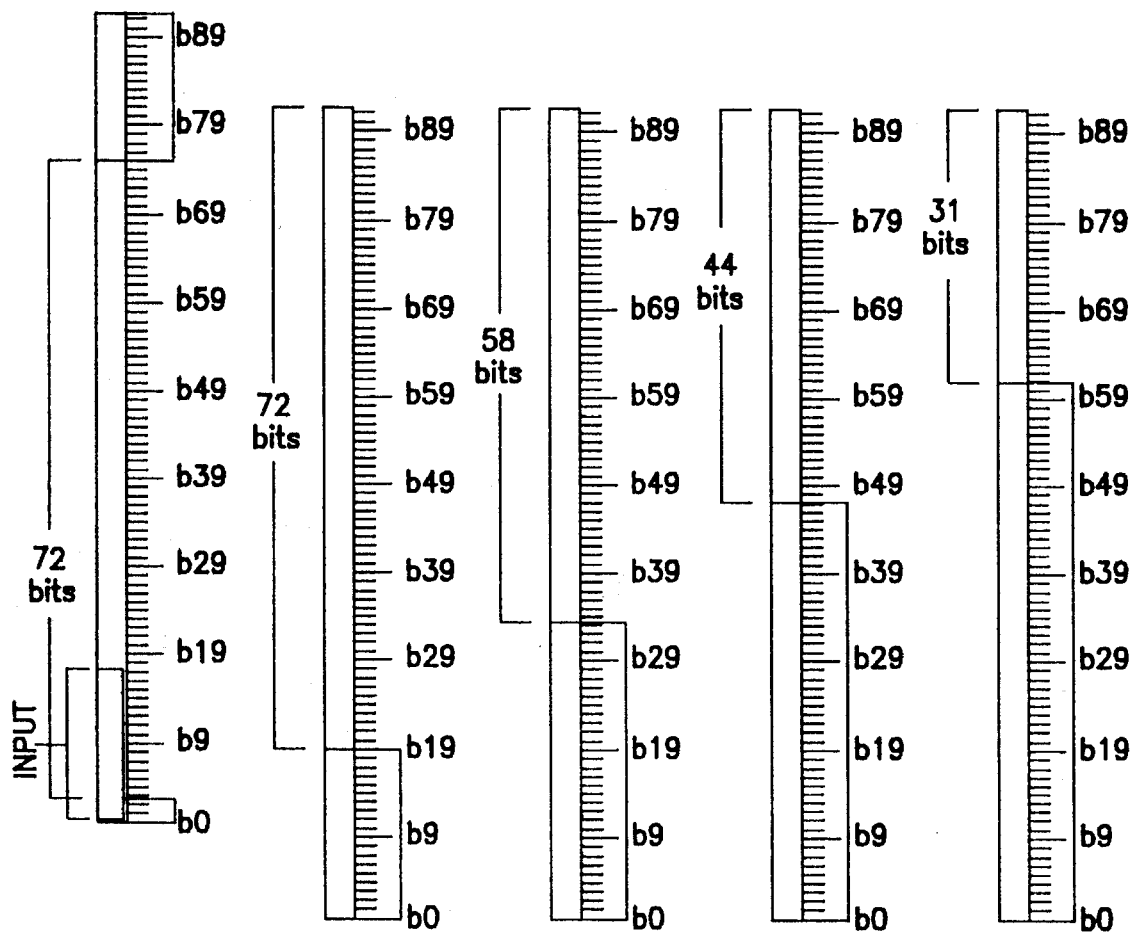

As decimation rates increase the input word position relative to the top of the filter registers shifts down by one bit at every time the decimation rate traverses a transition point signified by a change in bmax. When a decimation rate of 8192 is specified, the input register is at the bottom of the first integrator register. This is illustrated in FIG. 16.

Figure 17:
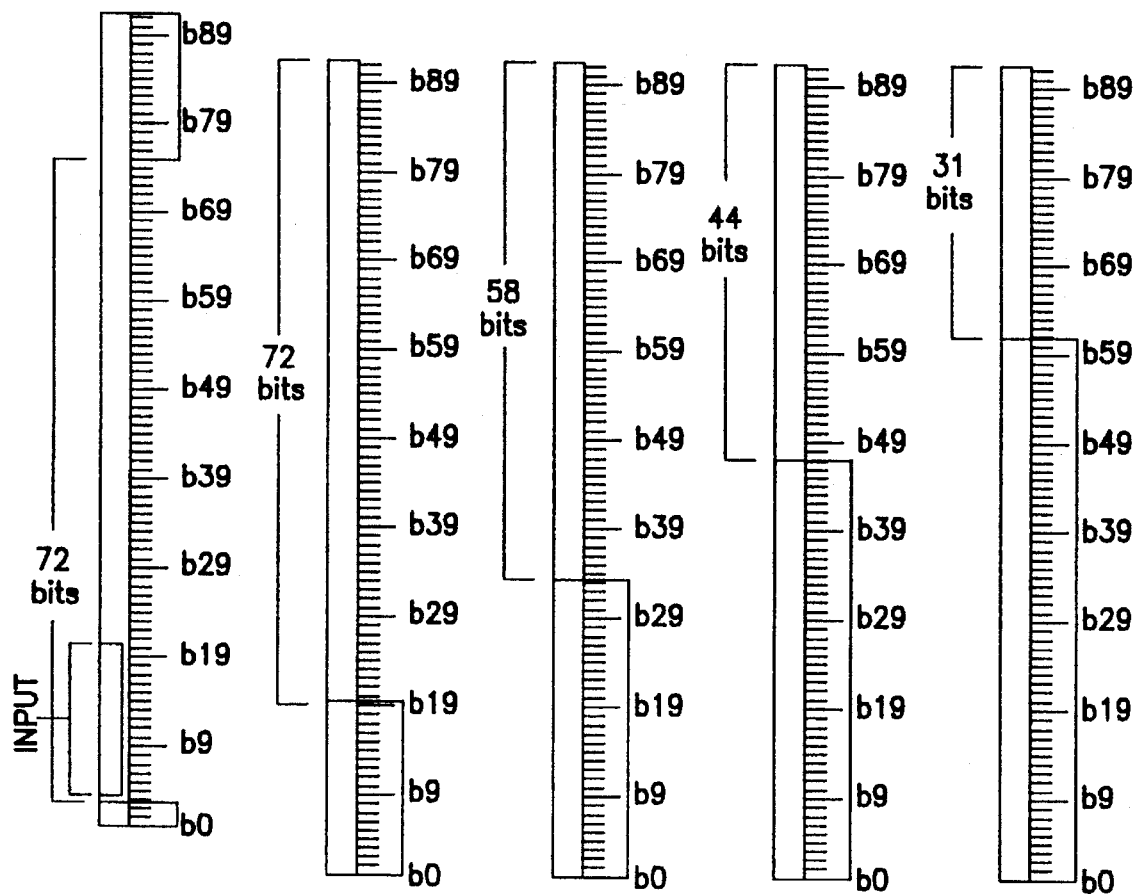

When a decimation rate of 8193 is specified, the first integrator register bit 86 is aligned with the top of the other filter registers and the top of the input word is aligned with bit b20 of the first integrator register. This configuration is shown in FIG. 17.

Figure 18:
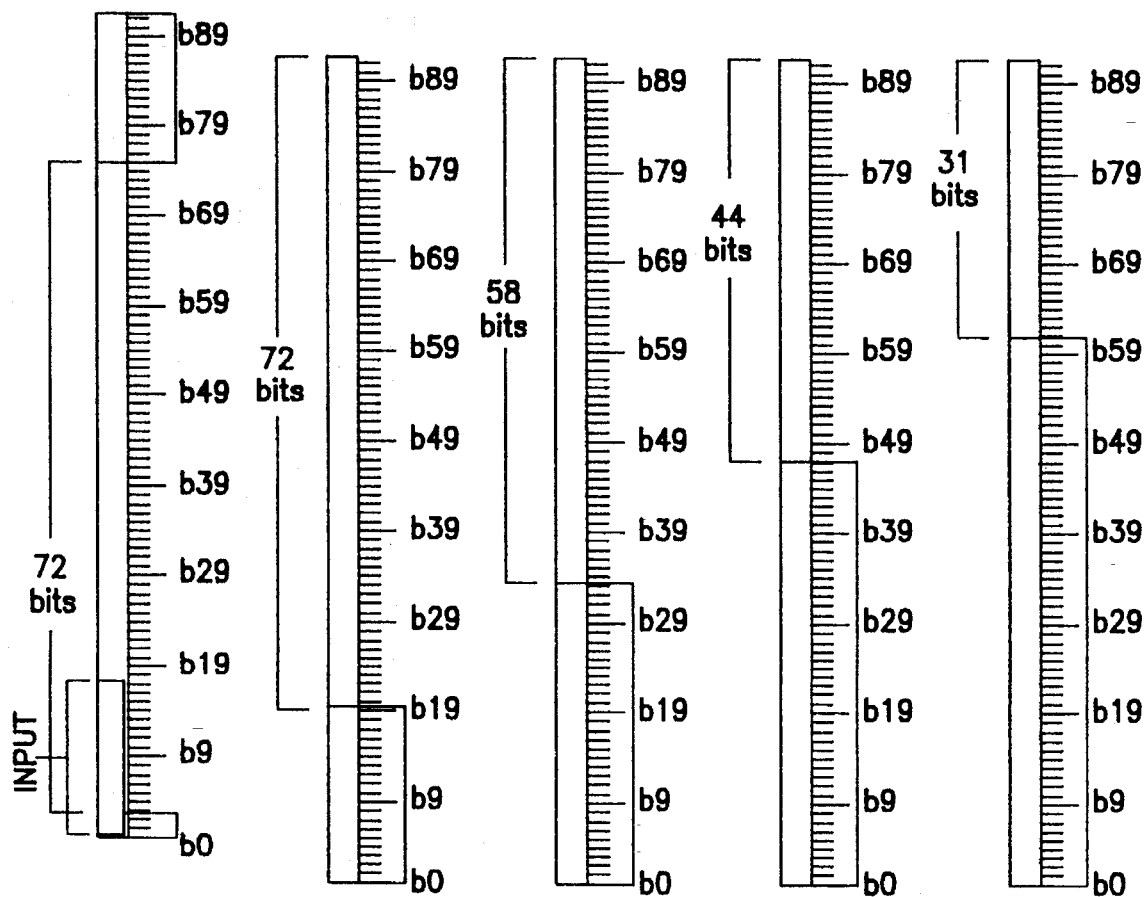

As decimation rates increase the input word position relative to the top of the filter registers shifts down by one bit at every time the decimation rate traverses a transition point signified by a change in bmax. When a decimation rate of 16,384 is specified, the input register is at the bottom of the first integrator register. This is illustrated in FIG. 18.

When a decimation rate of 16,385 is specified, the first integrator register bit 91 is aligned with the top of the other filter registers and the top of the input word is aligned with bit b20 of the first integrator register. This configuration is shown in FIG. 19.

As decimation rates increase the input word position relative to the top of the filter registers shifts down by one bit at every time the decimation rate traverses a transition point signified by a change in bmax. When a decimation rate of 32,768 is specified, the input register is at the bottom of the first integrator register. This is illustrated in FIG. 20.

The above description enables the implementation of all possible decimation rates specified. The configuration of the comb filter registers are always the same and is illustrated in FIG. 21.

Figure 22:
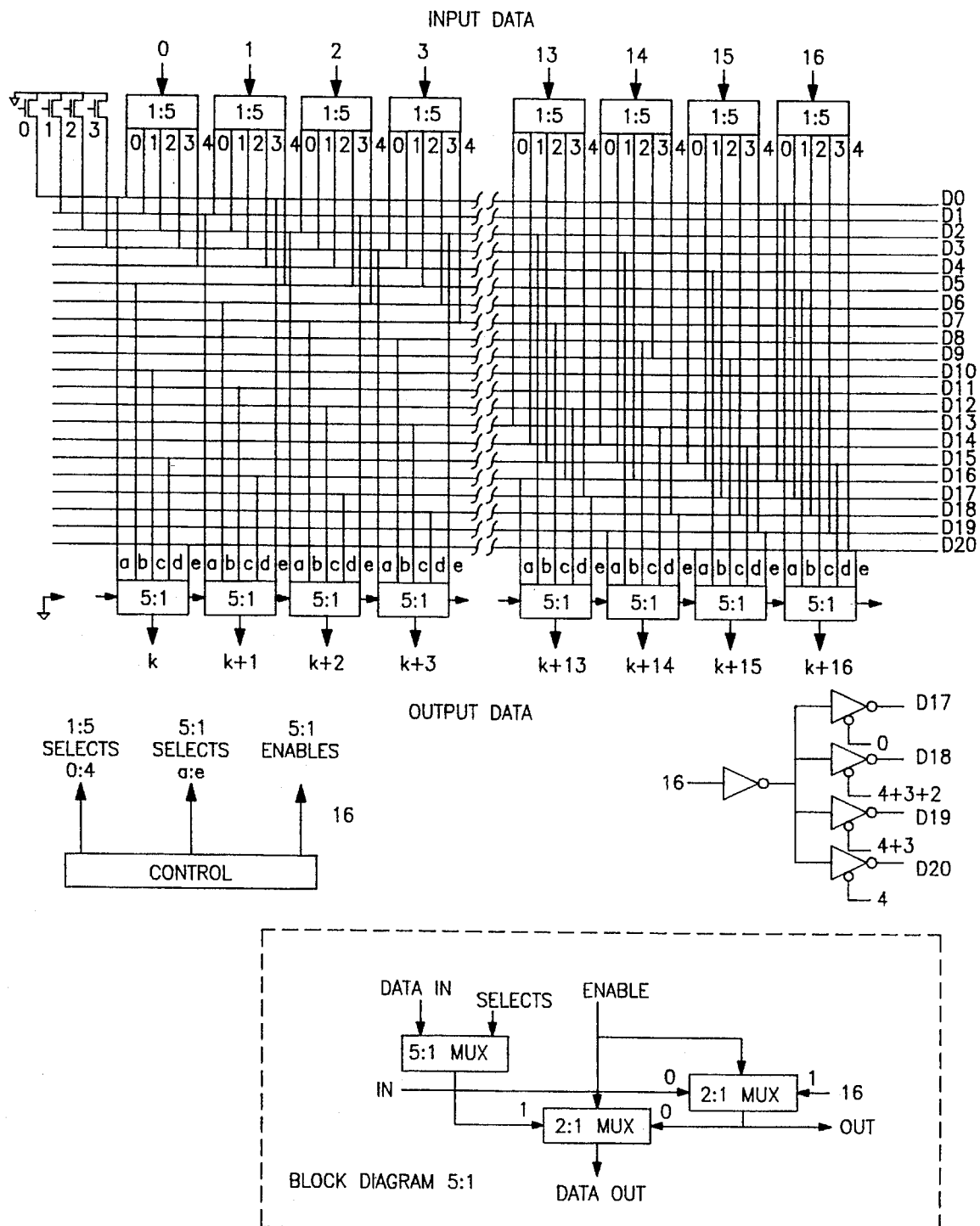
FIG. 22 is a schematic circuit diagram for a portion of the second preferred embodiment filter.

Shifter 1010 may be implemented as a 5:1 demultiplexer followed by an 49:5:1 multiplexer, and demultiplexer 1012 may be implemented as a 5:1 demultiplexer. With such an implementation, shifter 1010 connects a 17-bit input data sample through a 5:1 demultiplexer to 21 bit lines in a continuous succession of 17 of the 21 demultiplexer output lines. The 49:5:1 multiplexer switches in increments of 5 bit positions each. The 49:5:1 multiplexer is used to switch between separate sets of data input lines into first register 1001 providing the major incremental move of 5 bits each. N channel MOS transistor ground undriven Lines $D_0$–$D_3$, the tri-state inverters, drive the sign (16) on to undriven Lines D17–D20. FIG. 22 shows 17 of the 49 multiplexers.

Quadrature Decimation Filter

Figure 23:
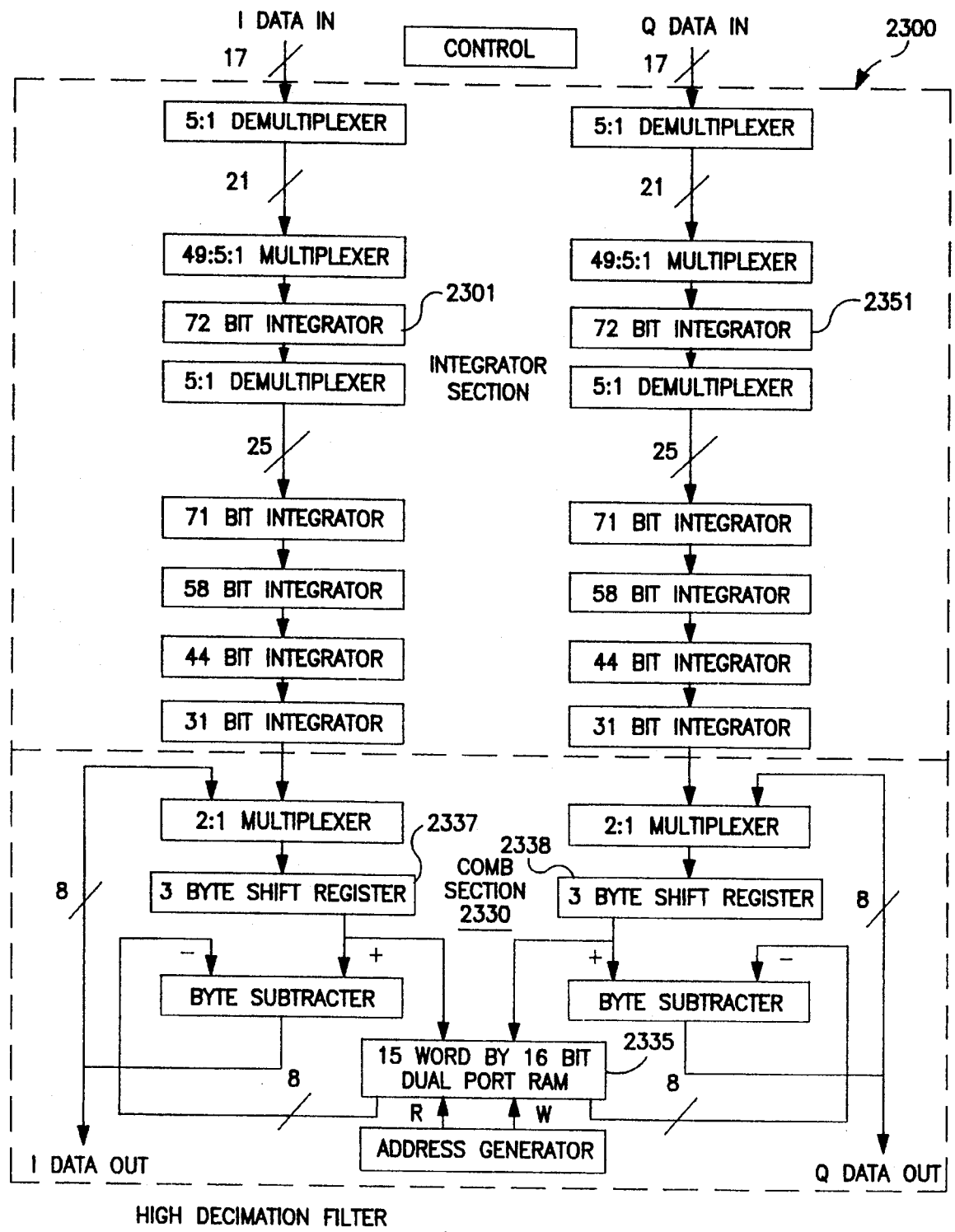
FIG. 23 shows a third preferred embodiment filter.

FIG. 23 heuristically shows third preferred embodiment quadrature decimation filter 2300 which includes an in-phase branch (I DATA IN and I DATA OUT) and a quadrature branch (Q DATA IN and Q DATA OUT) each with five integrator stages and a comb section. Filter 2300 has both the single subtractor comb section 2330 as in filter 800 and the shortened first integrator registers 2301 and 2351 plus shifters as in filter 1000. Comb section 2330 performs the subtractions on the 24-bit input stream one byte at a time and outputs 18-bit in-phase and quadrature samples in the form of three serial bytes. Shift registers 2337 and 2338 separate of the 24-bit input words into bytes, and the remainder of comb section 2330 operates as parallel 8-bit versions of comb section 830 of filter 800. That is, the same addresssing and read/write operations apply to common RAM 2335 for both branches. A single 16-bit stored word in RAM 2335 will consist of a byte for the in-phase branch and a byte for the quadrature branch. Because comb section 2330 decomposes the subtractions to the byte level, it uses three times as many subtractions. This then requires a minimum decimation rate of 15 to allow sufficient subtraction time. More generally, if N integrator stages were used and if they outputted M byte data to a serial comb section which used a single byte subtractor, then the minimum decimation rate would be MN.

Comb section 2330 does the three subtractions for the three bytes of the data words in succession and the table of operations is as follows with subscripts indicating the bytes from least significant to most significant:

| Clock | SReg out | Read from RAM | Subtractor output | Write into RAM |
|---|---|---|---|---|
| 0 | $w5_1$ | $w4_1$ | ... | $w5_1$ replaces $w4_1$ |
| 1 | $w5_2$ | $w4_2$ | $w5_1-w4_1$ | $w5_2$ replaces $w4_2$ |
| 2 | $w5_3$ | $w4_3$ | $w5_2-w4_2$ | $w5_3$ replaces $w4_3$ |
| 3 | $w5_1-w4_1$ | $w4_1-w3_1$ | $w5_3-w4_3$ | $w5_1-w4_1$ replaces $w4_1-w3_1$ |
| 4 | $w5_2-w4_2$ | $w4_2-w3_2$ | $(w5_1-w4_1)-(w4_1-w3_1)$ | $w5_1-w4_1$ replaces $w4_1-w3_1$ |
| ... | ... | ... | ... | ... |

Note that the shift register acts as a temporary storage (two clock cycle FIFO) of the subtractor output bytes.

Filter 2330 provides the advantages of both filters 800 and 1000 plus the simplicity of a common RAM for both in-phase and quadrature branches so that a single address generator and read/write command can be used.

Fabrication

Converter 300 may be fabricated with CMOS processing of silicon or any other fabricated method. The gate dimensions can be varied over a wide range, various CMOS processes such as metal, polysilicon or polycide gate, n-well, twin well, silicon-on-insulator, and so forth could be used. Also, BiCMOS processes could be used for faster operation and greater drive currents than with comparably-sized CMOS processes.

FURTHER MODIFICATIONS AND VARIATIONS

The preferred embodiments may be modified in many ways while retaining one of more of the features of a comb section with a single subtractor for serial subtractions and a shortened integrator register with interregister shifting.

For example, the decimation rates, the number of stages, the input data sample size, and the output sample size could all be separately varied; this would change the number and sizes of the registers and memory in the embodiments. Further, the use of a shortened first integrator register with alignment between the first and second integrator registers could be generalized to shortening the second register with possible alignment between the second and third registers, and possibly even shortening the third or later registers with possible alignment to the fourth, and so forth. High decimation rates led to the register shortening based on the lifetime of the realization of the filter, and low decimation rates demanded the shortened register alignment to a following register. Thus various combinations of maximum and minimum decimation rates lead to various combinations of shortening and alignment necessity.

A variation of the single subtractor comb section would be two subtractors with each subtractor doing one half of the subtractions; this cuts the minimum decimation rate in half.

As noted in Hogenauer, the combs could be modified to have a delay of more than 1. With such combs the features of the preferred embodiments still apply with an increase in memory size due to more items being stored. A single fixed decimation rate filter could also be designed using shortened registers and common comb but without requiring shifting and alignment multiplexers.

What is claimed is:

1. A decimation filter, comprising:
    (a) N integrator stages;
    (b) a comb section;
    (c) a sampling rate compressor connecting an output of said integrator stages to an input of said comb section and decimating the sampling rate of data at said output by a factor of R;
    (d) each of said integrator stages includes a register coupled to an adder, with the output of said integrator stages parallel coupled to the input of an adjacent one of said integrator stages and with said integrator stages' MSBs bits aligned except that the output of a first of said integrator stages is coupled to the input of a first data shifter and the output of said first data shifter is coupled to the input of a second of said integrator stages whereby said first data shifter adjusts the alignment of the MSB of said first integrator stage; and
    (e) the input of said first of said integrator stages is coupled to the output of a second data shifter, said second data shifter adjusts the alignment of input data samples with respect to said MSB of said first integrator stage, whereby said first and second data shifters adjust alignment in accordance to said decimation rate R.

2. The filter of claim 1, wherein:
    (a) said register of said first integrator stage contains fewer bits than said register of said second integrator stage.

3. The filter of claims 2, wherein;
    (a) said registers of said integrator stages in order of data propagation contain 68, 71, 58, 44, and 31 bits, respectively.

4. The filter of claim 1, wherein:
    (a) said decimation rate R is programmable.

5. A decimation filter, comprising:
    (a) integrator stages I1, I2, . . . In with the output of Ij parallel coupled to the input of I(j+1);
    (b) a comb section;
    (c) a sampling rate compressor connecting an output of said In to an input of said comb section and decimating the sampling rate of data at said output by a factor of R; and
    (d) each of said Ij includes a register plus an adder, with said I1, I2, . . . Ik also including a data shifter coupled to said register, whereby the MSB of said register of Ij are aligned with an offset to the MSB of said register of I(j+1) for j less than k and the MSB of input data to I1 are aligned with an offset to the MSB of said register of I1;
    (e) whereby said data shifters adjust alignment in accordance to said decimation rate R.

6. The filter of claim 5, wherein:
    (a) k equals 2.

7. A digital decimation filter having a high maximum decimation rate and a specified maximum error rate comprising:

a first register section having a digital input signal with a first sampling rate, means for selectively and incrementally shifting said digital input signal a maximum number of positions corresponding to the selected decimation rate of the filter to thereby produce a first shifted signal;

a first integrator section having a register coupled to an accumulator for integrating said first shifted signal and providing a first integrated signal;

a second register section having means for selectively shifting said first integrated signal a number of positions corresponding to the selected decimation rate of the filter to thereby produce a second shifted signal;

a second integrator section having a plurality of cascaded integrator stages each of which has an accumulator coupled to a register for integrating said second shifted signal to thereby produce a second integrated signal;

a sample section for sampling said second integrated signal at the selected decimation rate to thereby produce a sampled signal;

a serial comb section or serially processing said sampled signal and producing a digital output signal, said serial comb section comprising a multiplexer for multiplexing said sampled signal with said digital output signal to thereby produce a multiplexed signal, a serial subtractor for receiving said multiplexed signal and producing said digital output signal, and a serial random access memory for storing said multiplexed signal and providing data to said serial subtractor.

8. The filter of claim 7 wherein the specification of said maximum error rate is such that said maximum number of positions necessary to accommodate the digital input signal in said first register section is significantly decreased with respect to said maximum number of positions when said maximum error rate is specified thereby reducing the size of said first integrator section.

9. The filter of claim 8 wherein said bit register of said first integrator section is smaller than the register in the first integrator stage of said second integrator section.

10. The filter of claim 9 wherein said second integrator section has four integrator stages, said stages having a register size of respectively 65 bits, 53 bits, 41 bits, and 30 bits.

11. A digital decimation filter for decreasing the sample rate of a digital signal, said filter having a high maximum decimation rate and a specified maximum error rate comprising:

first shifting means for aligning a digital signal with an integrator;

first integrating means for integrating said shifted digital signal;

second shifting means for aligning said integrated shifted digital signal with an integrator;

second integrating means for integrating said second shifted digital signal to produce an integrated data signal; and a serial comb having a multiplexer, a serial subtractor and a RAM said multiplexer selectively supplying either said integrated data signal or a feedback signal from the subtractor to the subtractor and operatively connected to said RAM to produce a digital output signal with a sampling rate less than the original sample rate.

12. A quadrature decimation filter for decreasing the sample rate of a complex signal, said filter having a plurality of inputs one of which is an in-phase component of the complex signal and one of which is a quadrature component of the complex signal comprising:

an in-phase integrator branch for producing an in-phase integrated signal and a quadrature integrator branch for producing a quadrature integrated signal, each of said branches comprised of shifting means and integrating means;

an in-phase comb branch for receiving said in-phase integrated signal and a quadrature comb branch for receiving said quadrature integrated signal, each of said branches having a multiplexer for receiving said integrated signal an output filtered signal, and a nibble subtractor for receiving data from said multiplexer and for providing said output filtered signal; and a RAM common to both the in-phase and the quadrature branches and commonly addressed by both branches for receiving data from each of said multiplexers and providing data to each of said nibble subtractors.

* * * * *